(12) United States Patent
Rajyaguru et al.

(10) Patent No.: US 8,969,840 B2
(45) Date of Patent: Mar. 3, 2015

(54) DROPLET GENERATOR WITH ACTUATOR INDUCED NOZZLE CLEANING

(71) Applicant: ASML Netherlands B.V., Veldhoven (NL)

(72) Inventors: Chirag Rajyaguru, San Diego, CA (US); Peter M. Baumgart, San Diego, CA (US); Georgiy O. Vaschenko, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/452,418

(22) Filed: Aug. 5, 2014

(65) Prior Publication Data

US 2014/0346373 A1   Nov. 27, 2014

Related U.S. Application Data

(63) Continuation of application No. 13/874,306, filed on Apr. 30, 2013, now Pat. No. 8,829,477, which is a continuation-in-part of application No. 13/445,195, filed on Apr. 12, 2012, now Pat. No. 8,530,871, which is a continuation-in-part of application No. 12/721,317, filed on Mar. 10, 2010, now Pat. No. 8,158,960, said application No. 13/874,306 is a continuation-in-part of application No. 13/107,804, filed on May 13, 2011, now Pat. No. 8,513,629.

(51) Int. Cl.
*H05G 2/00* (2006.01)
*G03F 7/20* (2006.01)

(52) U.S. Cl.
CPC .............. *H05G 2/003* (2013.01); *H05G 2/008* (2013.01); *G03F 7/70033* (2013.01)
USPC .................................................. 250/504 R

(58) Field of Classification Search
USPC ...................................... 250/504 R; 378/143
See application file for complete search history.

(56) References Cited

U.S. PATENT DOCUMENTS 8,748,854 B2 * 6/2014 Vaschenko ................ 250/504 R

* cited by examiner

*Primary Examiner* — Kiet T Nguyen

(57) ABSTRACT

Systems (and methods therefor) for generating EUV radiation that comprise an arrangement producing a laser beam directed to an irradiation region and a droplet source. The droplet source includes a fluid exiting an orifice and a subsystem having an electro-actuatable element producing a disturbance in the fluid. The electro-actuatable element is driven by a first waveform to produce droplets for irradiation to generate the EUV radiation, the droplets produced by the first waveform having differing initial velocities causing at least some adjacent droplets to coalesce as the droplets travel to the irradiation region, and a second waveform, different from the first waveform, to dislodge contaminants from the orifice.

20 Claims, 15 Drawing Sheets

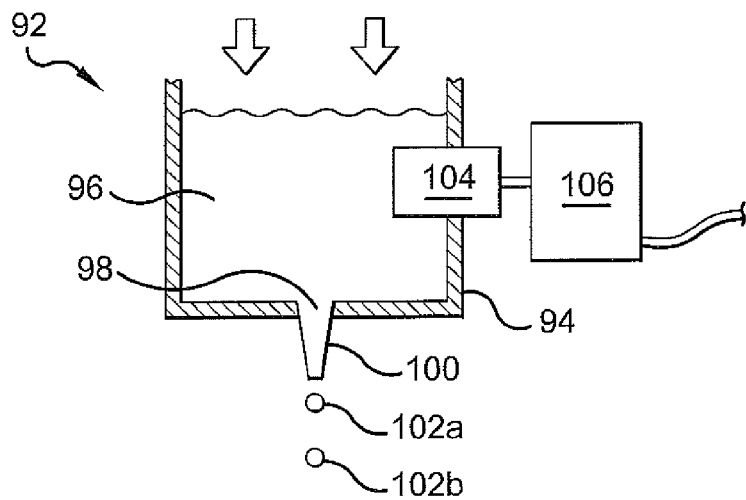
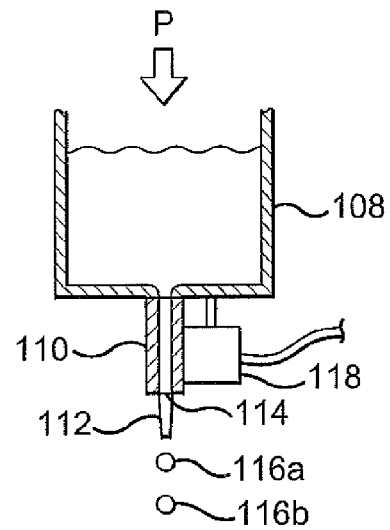
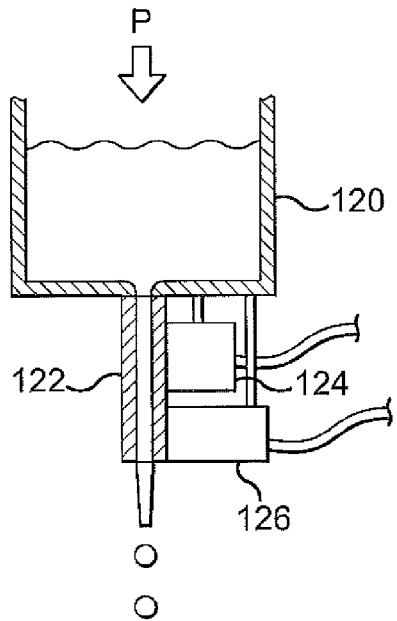
FIG.2
FIG.2A
FIG.2B

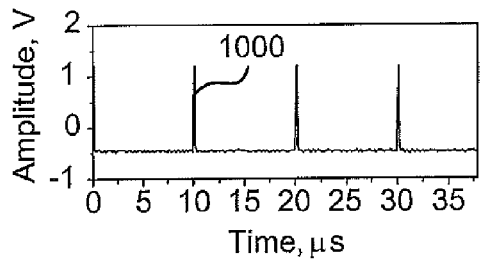
FIG.13A
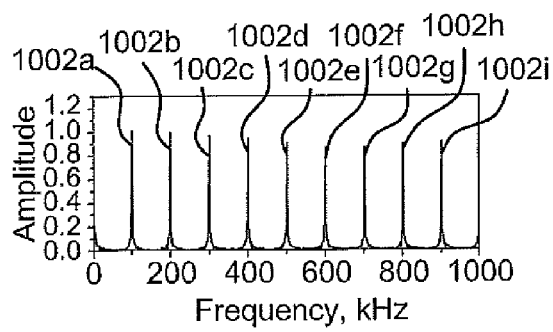
FIG.13B
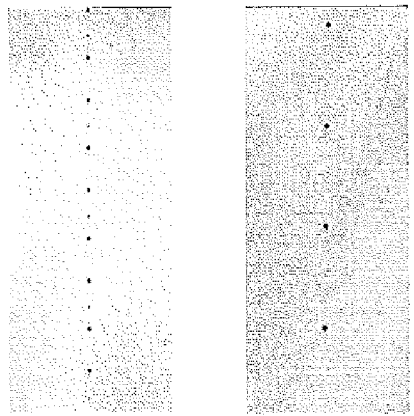
FIG.13C    FIG.13D
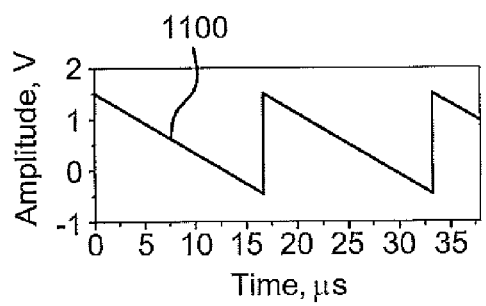
FIG.14A
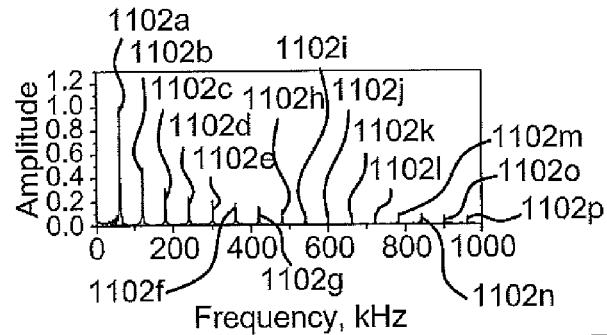
FIG.14B
    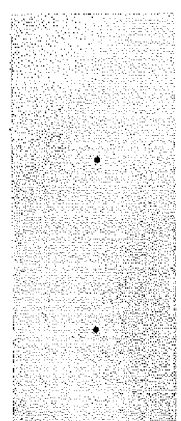
FIG.14C    FIG.14D

DROPLET GENERATOR WITH ACTUATOR INDUCED NOZZLE CLEANING

CROSS-REFERENCES TO RELATED APPLICATIONS

The present application is a continuation of U.S. patent Ser. No. 13/874,306, filed on Apr. 30, 2014, entitled DROPLET GENERATOR WITH ACTUATOR INDUCED NOZZLE CLEANING; which is a continuation-in-part of U.S. patent Ser. No. 13/445,195, filed on Apr. 12, 2012, now U.S. Pat. No. 8,530,871, issued on Sep. 10, 2013, entitled LASER PRODUCED PLASMA EUV LIGHT SOURCE; which is a continuation-in-part of U.S. patent Ser. No. 12/721,317, filed on Mar. 10, 2010, and issued on Apr. 17, 2012, as U.S. Pat. No. 8,158,960, entitled LASER PRODUCED PLASMA EUV LIGHT SOURCE, all of which are incorporated herein by reference. This application also claims priority from U.S. patent application Ser. No. 13/107,804, filed on May 13, 2011, and published on Nov. 15, 2012, as U.S. 2012/0286176A1, entitled DROPLET GENERATOR WITH ACTUATOR INDUCED NOZZLE CLEANING, all of which are incorporated herein by reference.

The present application is related to U.S. patent application Ser. No. 11/358,983, filed on Feb. 21, 2006, entitled SOURCE MATERIAL DISPENSER FOR EUV LIGHT SOURCE, now U.S. Pat. No. 7,378,673, issued on May 27, 2008; and U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE, now U.S. Pat. No. 7,897,947 issued on Mar. 1, 2011; the entire contents of which is hereby incorporated by reference herein.

FIELD

The present application relates to extreme ultraviolet ("EUV") light sources and their methods of operation. These light sources provide EUV light by creating plasma from a source material. In one application, the EUV light may be collected and used in a photolithography process to produce semiconductor integrated circuits.

BACKGROUND

A patterned beam of EUV light can be used to expose a resist coated substrate, such as a silicon wafer, to produce extremely small features in the substrate. Extreme ultraviolet light (also sometimes referred to as soft x-rays) is generally defined as electromagnetic radiation having wavelengths in the range of about 5-100 nm. One particular wavelength of interest for photolithography occurs at 13.5 nm, and efforts are currently underway to produce light in the range of 13.5 nm+/−2% which is commonly referred to as "in band EUV" for 13.5 nm systems.

Methods to produce EUV light include, but are not necessarily limited to, converting a source material into a plasma state that has a chemical element with an emission line in the EUV range. These elements can include, but are not necessarily limited to xenon, lithium and tin.

In one such method, often termed laser produced plasma ("LPP"), the required plasma can be produced by irradiating a source material, for example, in the form of a droplet, stream or wire, with a laser beam. In another method, often termed discharge produced plasma ("DPP"), the required plasma can be generated by positioning source material having an EUV emission line between a pair of electrodes and causing an electrical discharge to occur between the electrodes.

As indicated above, one technique to produce EUV light involves irradiating a source material. In this regard, $CO_2$ lasers outputting light at infra-red wavelengths, i.e., wavelengths in the range of about 9 µm to 11 µm, may present certain advantages as a so-called 'drive' laser irradiating a source material in an LPP process. This may be especially true for certain source materials, for example, source materials containing tin. One advantage may include the ability to produce a relatively high conversion efficiency between the drive laser input power and the output EUV power.

For LPP and DPP processes, the plasma is typically produced in a sealed vessel, such as a vacuum chamber, and monitored using various types of metrology equipment. In addition to generating in-band EUV radiation, these plasma processes also typically generate undesirable by-products. The by-products can include out-of-band radiation, high energy source material ions, low energy source material ions, excited source material atoms, and thermal source material atoms, produced by source material evaporation or by thermalizing source material ions in a buffer gas. The by-products can also include source material in the form of clusters and microdroplets of varying size and which exit the irradiation site at varying speeds. The clusters and microdroplets can deposit directly onto an optic or 'reflect' from the chamber walls or other structures in the chamber and deposit on an optic.

In more quantitative terms, one arrangement that is currently being developed with the goal of producing about 100 W of collected EUV radiation contemplates the use of a pulsed, focused 10-12 kW $CO_2$ drive laser which is synchronized with a droplet generator to sequentially irradiate about 40,000-100,000 tin droplets per second. For this purpose, there is a need to produce a stable stream of droplets at a relatively high repetition rate (e.g., 40-100 kHz or more) and deliver the droplets to an irradiation site with high accuracy and good repeatability in terms of timing and position (i.e. with very small "jitter") over relatively long periods of time. Generally, it is desirable to use relatively small droplets, such as droplets having a diameter in the range of about 10-50 µm to reduce the amount of plasma produced debris that is generated in the chamber.

One technique for generating droplets involves melting a target material such as tin and then forcing it under high pressure through a relatively small diameter orifice, such as an orifice having a diameter of about 0.5-30 µm, to produce a stream of droplets having droplet velocities of about 30-100 m/s. Under most conditions, naturally occurring instabilities, e.g. noise, in the stream exiting the orifice, may cause the stream to break-up into droplets. In order to synchronize the droplets with the optical pulses of an LPP drive laser, a repetitive disturbance with an amplitude exceeding that of the random noise may be applied to the continuous stream. By applying a disturbance at the same frequency (or its higher harmonics) as the repetition rate of the pulsed laser, the droplets can be synchronized with the laser pulses. For example, the disturbance may be applied to the stream by coupling an electro-actuatable element (such as a piezoelectric material) to the stream and driving the electro-actuatable element with a periodic waveform.

As used herein, the term "electro-actuatable element" and its derivatives, means a material or structure which undergoes a dimensional change when subjected to a voltage, electric field, magnetic field, or combinations thereof and includes, but is not limited to, piezoelectric materials, electrostrictive materials and magnetostrictive materials.

As indicated above, droplet generators are currently being designed to produce droplets continuously for relatively long periods such as several weeks or longer, producing billions of droplets. During these operational periods, it is generally not practical to stop and re-start the droplet generator. Moreover, during these operational periods, the relatively small nozzle orifice may become partially clogged with deposits from impurities in the target material. When the nozzle orifice becomes partially clogged, droplets may leave the nozzle in a different direction than they would if the nozzle was free of deposits. This change in droplet stream pointing can adversely affect EUV output and conversion efficiency by causing an incomplete or non-optimum interaction between the laser beam and droplet. Failure to properly irradiate a droplet may also increase the amount of certain types of problematic debris such as clusters and microdroplets.

During operation, the output beam from an EUV light source may be used by a lithography exposure tool such as a stepper or scanner. These exposure tools may first homogenize the beam from the light source and then impart the beam with a pattern in the beam's cross-section, using, for example, a reflective mask. The patterned beam can then be projected onto a portion of a resist-coated wafer. Once a first portion of the resist-coated wafer (often referred to as an exposure field) has been illuminated, the wafer, the mask or both may be moved to irradiate a second exposure field, and so on, until irradiation of the resist-coated wafer is complete. During this process, the scanner typically requires a so-called burst of pulses from the light source for each exposure field. For example, a typical burst period may last for a period of about 0.5 seconds and include about 20,000 EUV light pulses at a pulse repetition rate of about 40 kHz. The length of the burst period, number of pulses and repetition rate may be selected based on EUV output pulse energy, and the accumulated energy, or dose, specified for an exposure field. In some cases, pulse energy and/or repetition rate may change during a burst period and/or the burst may include one or more non-output periods.

In this process, sequential bursts may be temporally separated by an intervening period. During some intervening periods, which may last for about a fraction of a second, the exposure tool prepares to irradiate the next exposure field and does not need light from the light source. Longer intervening periods may occur when the exposure tool changes wafers. An even longer intervening period may occur when the exposure tool swaps out a so-called "boat" or cassette which holds a number of wafers, performs metrology, performs one or more maintenance functions, or performs some other scheduled or unscheduled process. Generally, during these intervening periods, EUV light is not required by the exposure tool, and, as a consequence, one, some, or all of these intervening periods may represent an opportunity to remove deposits from a droplet generator nozzle.

With the above in mind, Applicants disclose a Droplet Generator with Actuator Induced Nozzle Cleaning, and corresponding methods of use.

SUMMARY

The invention relates, in an embodiment, to a device comprising a system producing a laser beam directed to an irradiation region and a droplet source. The droplet source comprises a fluid exiting an orifice and a sub-system having an electro-actuatable element producing a disturbance in the fluid. The electro-actuatable element is driven by a first waveform to produce droplets for irradiation to generate EUV radiation, the droplets produced by the first waveform having differing initial velocities causing at least some adjacent droplets to coalesce as the droplets travel to the irradiation region, and a second waveform, different from the first waveform, to dislodge contaminants from the orifice.

Furthermore, the invention relates in an embodiment to a method comprising the steps of directing a laser beam to an irradiation region, providing a droplet source comprising a fluid exiting an orifice and a sub-system having an electro-actuatable element producing a disturbance in the fluid. The method also includes the step of driving the electro-actuatable element with a first waveform to produce droplets for irradiation by the laser beam to generate EUV radiation, the droplets having differing initial velocities causing at least some adjacent droplets to coalesce as the droplets travel to the irradiation region. The method further includes the step of driving the electro-actuatable element with a second waveform, different from the first waveform, to dislodge contaminants from the orifice.

In yet another embodiment, the invention relates to a device comprising a system producing a laser beam directed to an irradiation region and a droplet source that comprises a fluid exiting an orifice and a sub-system having an electro-actuatable element producing a disturbance in the fluid. The electro-actuatable element is driven by a waveform with a range of amplitudes from about $A_{min}$ to about $A_{max}$ which produces droplets which fully coalesce before reaching the irradiation region and have a stable droplet pointing for an unclogged orifice and wherein the waveform amplitude A is larger than about ⅔ $A_{max}$ to dislodge contaminants from the orifice while simultaneously producing droplets for generating an EUV producing plasma at the irradiation region.

In still another embodiment, the invention relates to a method comprising directing a laser beam to an irradiation region and providing a droplet source comprising a fluid exiting an orifice and a sub-system having an electro-actuatable element producing a disturbance in the fluid, the electro-actuatable element driven by a waveform. The method further comprises determining a range of amplitudes from about $A_{min}$ to about $A_{max}$ which produces droplets which fully coalesce before reaching the irradiation region and have stable droplet pointing for an unclogged orifice. The method additionally includes driving the electro-actuatable element with a waveform having an amplitude, A, larger than about ⅔ $A_{max}$ to dislodge contaminants from the orifice while simultaneously producing droplets for generating an EUV producing plasma at the irradiation region.

BRIEF DESCRIPTION OF THE DRAWINGS

FIGS. 2, 2A-2C, 3 and 4 illustrate several different techniques for coupling one or more electro-actuatable element(s) with a fluid to create a disturbance in a stream exiting an orifice;

FIGS. 13A-D show experimental results for fast pulse (FIG. 13A) modulation, including a frequency spectrum (FIG. 13B) for a fast pulse; an image of droplets taken at 20 mm from the output orifice (FIG. 13C) and an image of coalesced droplets taken at 450 mm from the output orifice (FIG. 13D);

FIGS. 14A-D show experimental results for fast ramp wave (FIG. 14A) modulation, including a frequency spectrum (FIG. 14B) for a fast ramp wave; an image of droplets taken at 20 mm from the output orifice (FIG. 14C) and an image of coalesced droplets taken at 450 mm from the output orifice (FIG. 14D)

DETAILED DESCRIPTION

Figure 1:
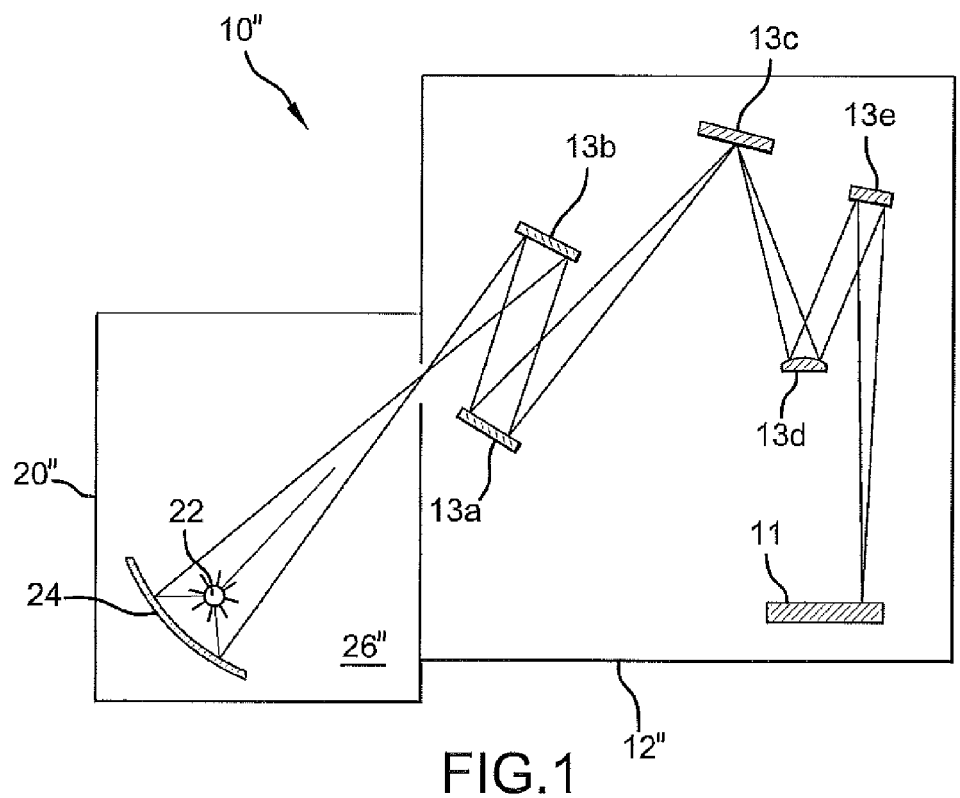
FIG. 1 shows a simplified schematic view of an EUV light source coupled with an exposure device.

With initial reference to FIG. 1, there is shown a simplified, schematic, sectional view of selected portions of one example of an BUY photolithography apparatus, generally designated 10". The apparatus 10" may be used, for example, to expose a substrate 11 such as a resist coated wafer with a patterned beam of EUV light. For the apparatus 10", an exposure device 12" utilizing EUV light, (e.g., an integrated circuit lithography tool such as a stepper, scanner, step and scan system, direct write system, device using a contact and/or proximity mask, etc.), may be provided having one or more optics 13a,b, for example, to illuminate a patterning optic 13c with a beam of BUY light, such as a reticle, to produce a patterned beam, and one or more reduction projection optic(s) 13d, 13e, for projecting the patterned beam onto the substrate 11. A mechanical assembly (not shown) may be provided for generating a controlled relative movement between the substrate 11 and patterning means 13c. As further shown in FIG. 1, the apparatus 10" may include an EUV light source 20" including an EUV light radiator 22 emitting EUV light in a chamber 26" that is reflected by optic 24 along a path into the exposure device 12" to irradiate the substrate 11.

As used herein, the term "optic" and its derivatives is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic" nor its derivatives, as used herein, are meant to be limited to components which operate solely or to advantage within one or more specific wavelength range(s) such as at the EUV output light wavelength, the irradiation laser wavelength, a wavelength suitable for metrology or any other specific wavelength.

Figure 1A:
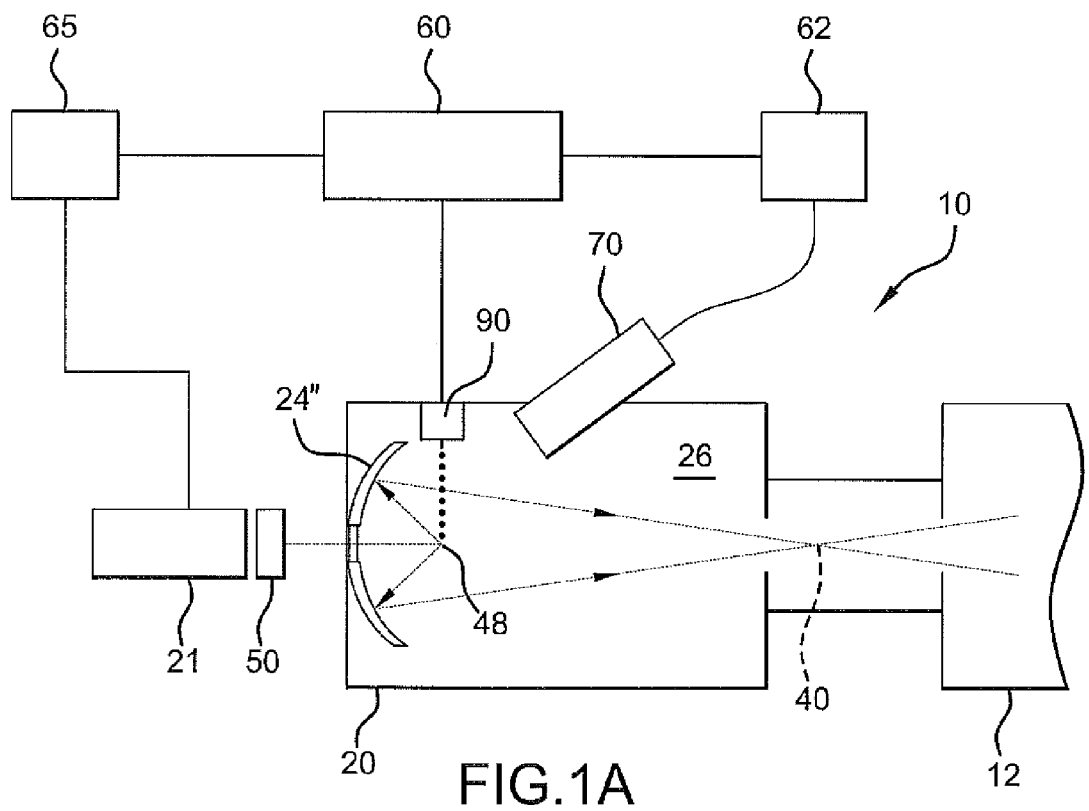
FIG. 1A shows a simplified, schematic diagram of an apparatus including an EUV light source having an LPP EUV light radiator.

FIG. 1A illustrates a specific example of an apparatus 10 including an EUV light source 20 having an LPP BUY light radiator. As shown, the EUV light source 20 may include a system 21 for generating a train of light pulses and delivering the light pulses into a light source chamber 26. For the apparatus 10, the light pulses may travel along one or more beam paths from the system 21 and into the chamber 26 to illuminate source material at an irradiation region 48 to produce an EUV light output for substrate exposure in the exposure device 12.

Suitable lasers for use in the system 21 shown in FIG. 1A, may include a pulsed laser device, e.g., a pulsed gas discharge $CO_2$ laser device producing radiation at 9.3 μm or 10.6 μm, e.g., with DC or RF excitation, operating at relatively high power, e.g., 10 kW or higher and high pulse repetition rate, e.g., 50 kHz or more. In one particular implementation, the laser may be an axial-flow RF-pumped $CO_2$ laser having an oscillator-amplifier configuration (e.g., master oscillator/power amplifier (MOPA) or power oscillator/power amplifier (POPA)) with multiple stages of amplification and having a seed pulse that is initiated by a Q-switched oscillator with relatively low energy and high repetition rate, e.g., capable of 100 kHz operation. From the oscillator, the laser pulse may then be amplified, shaped and/or focused before reaching the irradiation region 48. Continuously pumped $CO_2$ amplifiers may be used for the laser system 21. For example, a suitable $CO_2$ laser device having an oscillator and three amplifiers (O-PA1-PA2-PA3 configuration) is disclosed in U.S. patent application Ser. No. 11/174,299 filed on Jun. 29, 2005, entitled, LPP EUV LIGHT SOURCE DRIVE LASER SYSTEM, now U.S. Pat. No. 7,439,530, issued on Oct. 21, 2008, the entire contents of which are hereby incorporated by reference herein.

Alternatively, the laser may be configured as a so-called "self-targeting" laser system in which the droplet serves as one mirror of the optical cavity. In some "self-targeting" arrangements, an oscillator may not be required. Self-targeting laser systems are disclosed and claimed in U.S. patent application Ser. No. 11/580,414 filed on Oct. 13, 2006, entitled, DRIVE LASER DELIVERY SYSTEMS FOR EUV LIGHT SOURCE, now U.S. Pat. No. 7,491,954, issued on Feb. 17, 2009, the entire contents of which are hereby incorporated by reference herein.

Depending on the application, other types of lasers may also be suitable, e.g., an excimer or molecular fluorine laser operating at high power and high pulse repetition rate. Other examples include, a solid state laser, e.g., having a fiber, rod, slab, or disk-shaped active media, other laser architectures having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, or a solid state laser that seeds one or more excimer, molecular fluorine or $CO_2$ amplifier or oscillator chambers, may be suitable. Other designs may be suitable.

In some instances, a source material may first be irradiated by a pre-pulse and thereafter irradiated by a main pulse. Pre-pulse and main pulse seeds may be generated by a single oscillator or two separate oscillators. In some setups, one or more common amplifiers may be used to amplify both the pre-pulse seed and main pulse seed. For other arrangements, separate amplifiers may be used to amplify the pre-pulse and main pulse seeds. For example, the seed laser may be a $CO_2$ laser having a sealed gas including $CO_2$ at sub-atmospheric pressure, e.g., 0.05-0.2 atm, that is pumped by a radio-frequency (RF) discharge. With this arrangement, the seed laser may self-tune to one of the dominant lines such as the 10P(20) line having wavelength 10.5910352 μm. In some cases, Q switching may be employed to control seed pulse parameters.

A suitable amplifier for use with a seed laser having a gain media including $CO_2$ described above, may include a gain media containing $CO_2$ gas that is pumped by DC or RF excitation. In one particular implementation, the amplifier may include an axial-flow, RF-pumped (continuous or with pulse modulation) $CO_2$ amplification unit. Other types of amplification units having fiber, rod, slab or disk-shaped active media may be used. In some cases, a solid active media may be employed.

The amplifier may have two (or more) amplification units each having its own chamber, active media and excitation source, e.g., pumping electrodes. For example, for the case where the seed laser includes gain media, including $CO_2$ described above, suitable lasers for use as amplification units, may include an active media containing $CO_2$ gas that is pumped by DC or RF excitation. In one particular implementation, the amplifier may include a plurality, such as four or five, axial-flow, RF-pumped (continuous or pulsed) $CO_2$ amplification units having a total gain length of about 10-25 meters, and operating, in concert, at relatively high power, e.g., 10 kW or higher. Other types of amplification units having fiber, rod, slab or disk-shaped active media may be used. In some cases, a solid active media may be employed.

FIG. 1A also shows that the apparatus 10 may include a beam conditioning unit 50 having one or more optics for beam conditioning such as expanding, steering, and/or focusing the beam between the laser source system 21 and irradiation site 48. For example, a steering system, which may include one or more mirrors, prisms, lenses, etc., may be provided and arranged to steer the laser focal spot to different locations in the chamber 26. For example, the steering system may include a first flat mirror mounted on a tip-tilt actuator which may move the first mirror independently in two dimensions, and a second flat mirror mounted on a tip-tilt actuator which may move the second mirror independently in two dimensions. With this arrangement, the steering system may controllably move the focal spot in directions substantially orthogonal to the direction of beam propagation (beam axis).

The beam conditioning unit 50 may include a focusing assembly to focus the beam to the irradiation site 48 and adjust the position of the focal spot along the beam axis. For the focusing assembly, an optic, such as a focusing lens or mirror, may be used that is coupled to an actuator for movement in a direction along the beam axis to move the focal spot along the beam axis.

Further details regarding beam conditioning systems are provided in U.S. patent application Ser. No. 10/803,526, filed on Mar. 17, 2004, entitled A HIGH REPETITION RATE LASER PRODUCED PLASMA EUV LIGHT SOURCE, now U.S. Pat. No. 7,087,914, issued on Aug. 8, 2006; U.S. Ser. No. 10/900,839 filed on Jul. 27, 2004, entitled EUV LIGHT SOURCE, now U.S. Pat. No. 7,164,144, issued on Jan. 16, 2007; and U.S. patent application Ser. No. 12/638,092, filed on Dec. 15, 2009, entitled BEAM TRANSPORT SYSTEM FOR EXTREME ULTRAVIOLET LIGHT SOURCE, now U.S. Pat. No. 8,173,985, issued on May 8, 2012, the contents of each of which are hereby incorporated by reference.

As further shown in FIG. 1A, the EUV light source 20 may also include a source material delivery system 90, e.g., delivering source material, such as tin droplets, into the interior of chamber 26 to an irradiation region 48, where the droplets will interact with light pulses from the system 21, to ultimately produce plasma and generate an EUV emission to expose a substrate such as a resist coated wafer in the exposure device 12. More details regarding various droplet dispenser configurations and their relative advantages may be found in U.S. patent application Ser. No. 12/721,317, filed on Mar. 10, 2010, and published on Nov. 25, 2010, as US 2010-0294953-A1, entitled LASER PRODUCED PLASMA EUV LIGHT SOURCE, now U.S. Pat. No. 8,158,960, issued on Apr. 17, 2012; U.S. Ser. No. 12/214,736, filed on Jun. 19, 2008, now U.S. Pat. No. 7,872,245, issued on Jan. 18, 2011, entitled SYSTEMS AND METHODS FOR TARGET MATERIAL DELIVERY IN A LASER PRODUCED PLASMA EUV LIGHT SOURCE; U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE, now U.S. Pat. No. 7,897,947, issued on Mar. 1, 2011; U.S. patent application Ser. No. 11/358,988, filed on Feb. 21, 2006, entitled LASER PRODUCED PLASMA EUV LIGHT SOURCE WITH PRE- PULSE, and published on Nov. 16, 2006 as US2006/ 0255298A-1; U.S. patent application Ser. No. 11/067,124, filed on Feb. 25, 2005, entitled METHOD AND APPARATUS FOR EUV PLASMA SOURCE TARGET DELIVERY; now U.S. Pat. No. 7,405,416, issued on Jul. 29, 2008; and U.S. patent application Ser. No. 11/174,443, filed on Jun. 29, 2005, entitled LPP EUV PLASMA SOURCE MATERIAL TARGET DELIVERY SYSTEM, now U.S. Pat. No. 7,372,056, issued on May 13, 2008; the contents of each of which are hereby incorporated by reference.

The source material for producing an EUV light output for substrate exposure may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the source material may be presented to the irradiation region at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in U.S. patent application Ser. No. 11/406,216, filed on Apr. 17, 2006, entitled ALTERNATIVE FUELS FOR EUV LIGHT SOURCE, now U.S. Pat. No. 7,465,946, issued on Dec. 16, 2008, the contents of which are hereby incorporated by reference herein.

Continuing with reference to FIG. 1A, the apparatus 10 may also include an EUV controller 60, which may also include a drive laser control system 65 for controlling devices in the system 21 to thereby generate light pulses for delivery into the chamber 26, and/or for controlling movement of optics in the beam conditioning unit 50. The apparatus 10 may also include a droplet position detection system which may include one or more droplet imagers 70 that provide an output indicative of the position of one or more droplets, e.g., relative to the irradiation region 48. The imager(s) 70 may provide this output to a droplet position detection feedback system 62, which can, e.g., compute a droplet position and trajectory, from which a droplet error can be computed, e.g., on a droplet-by-droplet basis, or on average. The droplet error may then be provided as an input to the controller 60, which can, for example, provide a position, direction and/or timing correction signal to the system 21 to control laser trigger timing and/or to control movement of optics in the beam conditioning unit 50, e.g., to change the location and/or focal power of the light pulses being delivered to the irradiation region 48 in the chamber 26. Also for the EUV light source 20, the source material delivery system 90 may have a control system operable in response to a signal (which in some implementations may include the droplet error described above, or some quantity derived therefrom) from the controller 60, to e.g., modify the release point, initial droplet stream direction, droplet release timing and/or droplet modulation to correct for errors in the droplets arriving at the desired irradiation region 48.

Continuing with FIG. 1A, the apparatus 10 may also include an optic 24" such as a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. FIG. 1A shows that the optic 24" may be formed with an aperture to allow the light pulses generated by the system 21 to pass through and reach the irradiation region 48. As shown, the optic 24" may be, e.g., a prolate spheroid mirror that has a first focus within or near the irradiation region 48 and a second focus at a so-called intermediate region 40, where the EUV light may be output from the EUV light source 20 and input to an exposure device 12 utilizing EUV light, e.g., an integrated circuit lithography tool. It is to be appreciated that other optics may be used in place of the prolate spheroid mirror for collecting and directing light to an intermediate location for subsequent delivery to a device utilizing EUV light. For example, the optic may be a parabola rotated about its major axis or may be configured to deliver a beam having a ring-shaped cross-section to an intermediate location, see e.g., U.S. patent application Ser. No. 11/505,177, filed on Aug. 16, 2006, now U.S. Pat. No. 7,843,632, issued on Nov. 30, 2010, entitled EUV OPTICS, the contents of which are hereby incorporated by reference.

A buffer gas such as hydrogen, helium, argon or combinations thereof, may be introduced into, replenished and/or removed from the chamber 26. The buffer gas may be present in the chamber 26 during plasma discharge and may act to slow plasma created ions to reduce optic degradation and/or increase plasma efficiency. Alternatively, a magnetic field and/or electric field (not shown) may be used alone, or in combination with a buffer gas, to reduce fast ion damage.

FIG. 2 illustrates the components of a simplified droplet source 92 in schematic format. As shown there, the droplet source 92 may include a reservoir 94 holding a fluid, e.g. molten tin, under pressure. Also shown, the reservoir 94 may be formed with an orifice 98 allowing the pressurized fluid 96 to flow through the orifice establishing a continuous stream 100 which subsequently breaks into a plurality of droplets 102a, b.

Figure 2C:
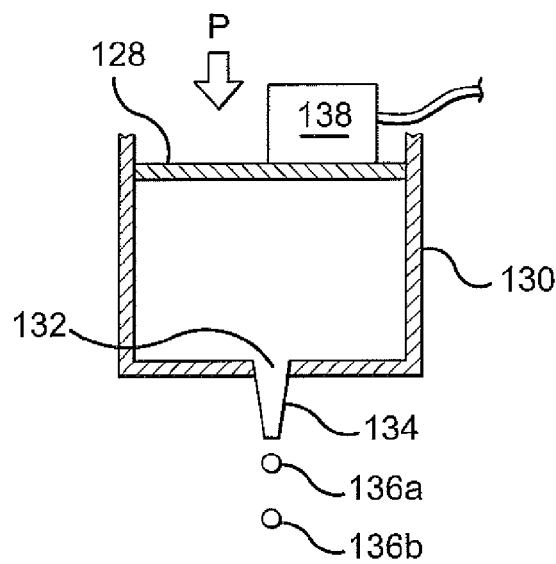
Figure 3:
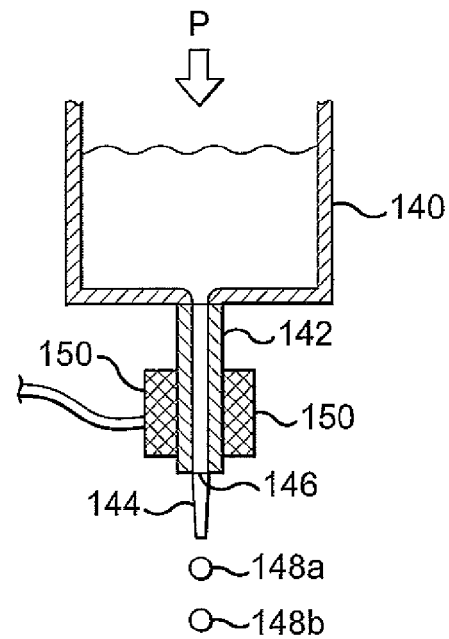

Continuing with FIG. 2, the droplet source 92 shown further includes a sub-system producing a disturbance in the fluid having an electro-actuatable element 104 that is operably coupled with the fluid 96 and a signal generator 106 driving the electro-actuatable element 104. FIGS. 2A-2C, 3 and 4 show various ways in which one or more electro-actuatable element(s) may be operably coupled with the fluid to create droplets. Beginning with FIG. 2A, an arrangement is shown in which the fluid is forced to flow from a reservoir 108 under pressure through a tube 110, e.g., capillary tube, having an inside diameter between about 0.5-0.8 mm, and a length of about 10 to 50 mm, creating a continuous stream 112 exiting an orifice 114 of the tube 110 which subsequently breaks up into droplets 116a,b. As shown, an electro-actuatable element 118 may be coupled to the tube. For example, an electro-actuatable element may be coupled to the tube 110 to deflect the tube 110 and disturb the stream 112. FIG. 2B shows a similar arrangement having a reservoir 120, tube 122 and a pair of electro-actuatable elements 124, 126, each coupled to the tube 122 to deflect the tube 122 at a respective frequency. FIG. 2C shows another variation in which a plate 128 is positioned in a reservoir 130 moveable to force fluid through an orifice 132 to create a stream 134 which breaks into droplets 136a,b. As shown, a force may be applied to the plate 128 and one or more electro-actuatable elements 138 may be coupled to the plate to disturb the stream 134. It is to be appreciated that a capillary tube may be used with the embodiment shown in FIG. 2C. FIG. 3 shows another variation, in which a fluid is forced to flow from a reservoir 140 under pressure through a tube 142 creating a continuous stream 144, exiting an orifice 146 of the tube 142, which subsequently breaks-up into droplets 148a,b. As shown, an electro-actuatable element 150, e.g., having a ring-shape or cylindrical tube shape, may be positioned to surround a circumference of the tube 142. When driven, the electro-actuatable element 150 may selectively squeeze and/or un-squeeze the tube 142 to disturb the stream 144. It is to be appreciated that two or more electro-actuatable elements may be employed to selectively squeeze the tube 142 at respective frequencies.

Figure 4:
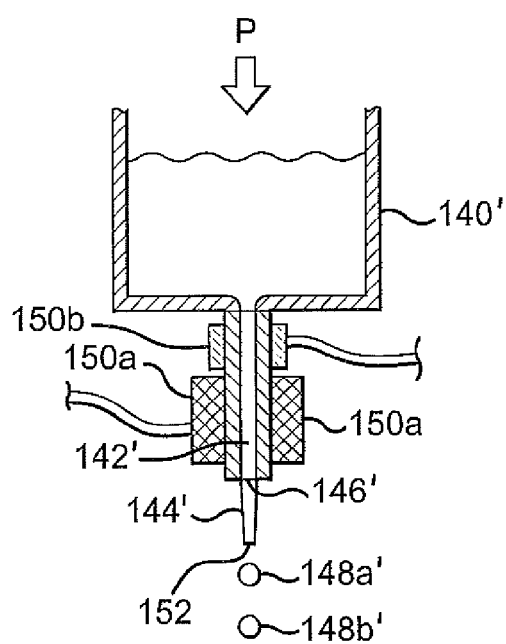

FIG. 4 shows another variation, in which a fluid is forced to flow from a reservoir 140' under pressure through a tube 142' creating a continuous stream 144', exiting an orifice 146' of the tube 142', which subsequently breaks-up into droplets 148a',b'. As shown, an electro-actuatable element 150a, e.g., having a ring-shape, may be positioned to surround a circumference of the tube 142'. When driven, the electro-actuatable element 150a may selectively squeeze and/or un-squeeze the tube 142' to disturb the stream 144' and produce droplets. FIG. 4 also shows that a second electro-actuatable element 150b, e.g. having a ring-shape, may be positioned to surround a circumference of the tube 142'. When driven, the electro-actuatable element 150b may selectively squeeze and/or un-squeeze the tube 142' to disturb the stream 144' and dislodge contaminants from the orifice 152. For the embodiment shown, electro-actuatable elements 150a and 150b may be driven by the same signal generator or different signal generators may be used. As described further below, waveforms having different waveform amplitude, periodic frequency and/or waveform shape may be used to drive electro-actuatable element 150a (to produce droplets for EUV output) than electro-actuatable element 150b (to dislodge contaminants).

Figure 5:
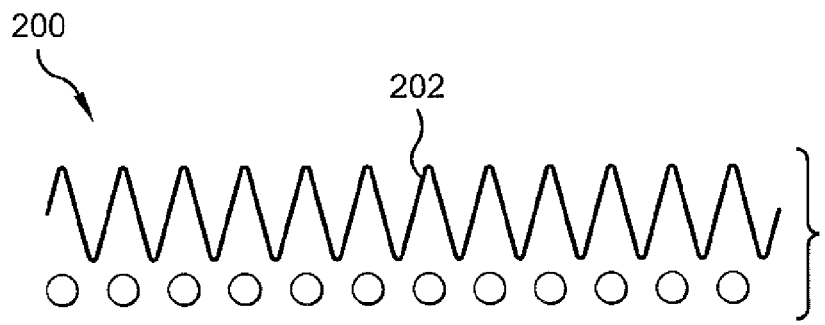
FIG. 5 illustrates the pattern of droplets resulting from a single frequency, non-modulated disturbance waveform.

FIG. 5 illustrates the pattern of droplets 200 resulting from a single frequency, sine wave disturbance waveform 202 (for disturbance frequencies above about $0.3\upsilon/(\pi d)$). It can be seen that each period of the disturbance waveform produces a droplet. FIG. 5 also illustrates that the droplets do not coalesce together, but rather, each droplet is established with the same initial velocity.

Figure 6:
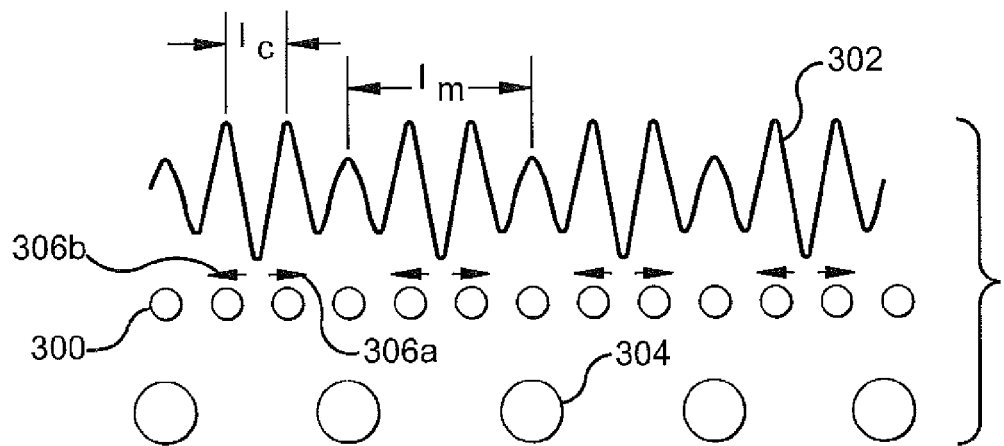
FIG. 6 illustrates the pattern of droplets resulting from an amplitude modulated disturbance waveform.

FIG. 6 illustrates the pattern of droplets 300 initially resulting from an amplitude modulated disturbance waveform 302. It can be seen that the amplitude modulated waveform disturbance 302 includes two characteristic frequencies, a relatively large frequency, e.g., carrier frequency, corresponding to wavelength $\lambda_c$, and a smaller frequency, e.g., modulation frequency, corresponding to wavelength, $\lambda_m$. For the specific disturbance waveform example shown in FIG. 6, the modulation frequency is a carrier frequency subharmonic, and in particular, the modulation frequency is a third of the carrier frequency. With this waveform, FIG. 6 illustrates that each period of the disturbance waveform corresponding to the carrier wavelength, $\lambda_c$, produces a droplet, FIG. 6 also illustrates that the droplets coalesce together, resulting in a stream of larger droplets 304, with one larger droplet for each period of the disturbance waveform corresponding to the modulation wavelength, $\lambda_m$. Arrows 306a,b show the initial relative velocity components that are imparted on the droplets by the modulated waveform disturbance 302, and are responsible for the droplet coalescence.

Figure 7:
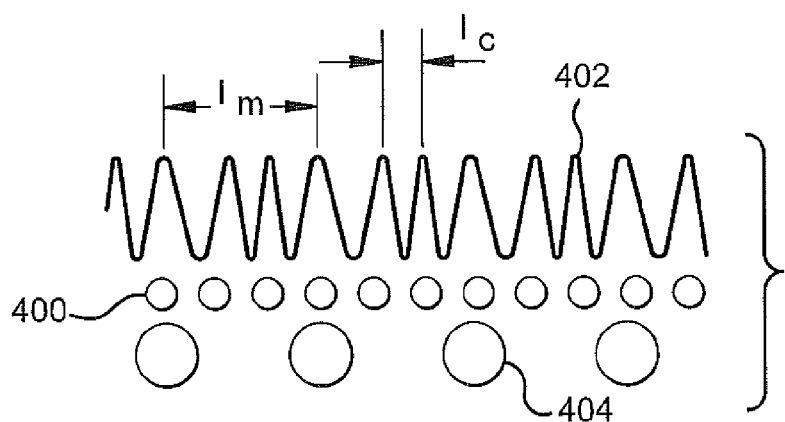
FIG. 7 illustrates the pattern of droplets resulting from a frequency modulated disturbance waveform.

FIG. 7 illustrates the pattern of droplets 400 initially resulting from a frequency modulated disturbance waveform 402. It can be seen that the frequency modulated waveform disturbance 402 includes two characteristic frequencies, a relatively large frequency, e.g. carrier frequency, corresponding to wavelength $\lambda_c$, and a smaller frequency, e.g. modulation frequency, corresponding to wavelength, $\lambda_m$. For the specific disturbance waveform example shown in FIG. 7, the modulation frequency is a carrier frequency subharmonic, and in particular, the modulation frequency is a third of the carrier frequency. With this waveform, FIG. 7 illustrates that each period of the disturbance waveform corresponding to the carrier wavelength, $\lambda_c$ produces a droplet. FIG. 7 also illustrates that the droplets coalesce together, resulting in a stream of larger droplets 404, with one larger droplet for each period of the disturbance waveform corresponding to the modulation wavelength, $\lambda_m$. Like the amplitude modulated disturbance (i.e., FIG. 6), initial relative velocity components are imparted on the droplets by the frequency modulated waveform disturbance 402, and are responsible for the droplet coalescence.

Although FIGS. 6 and 7 show and discuss embodiments having two characteristic frequencies, with FIG. 6 illustrating an amplitude modulated disturbance having two characteristic frequencies, and FIG. 7 illustrating a frequency modulated disturbance having two frequencies, it is to be appreciated that more than two characteristic frequencies may be employed, and that the modulation may be either angular modulation (i.e., frequency or phase modulation), amplitude modulation, or combinations thereof.

Figure 8:
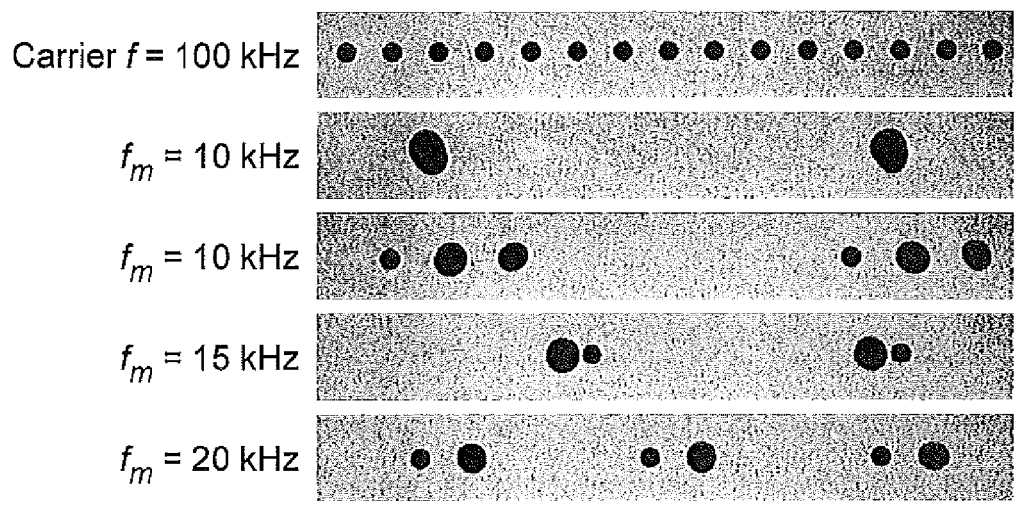
FIG. 8 shows photographs of tin droplets obtained for a single frequency, non-modulated waveform disturbance and several frequency modulated waveform disturbances.

FIG. 8 shows photographs of tin droplets obtained using an apparatus similar to FIG. 3 with an orifice diameter of about 70 μm, stream velocity of ~30 m/s, for a single frequency, non-modulated waveform disturbance having a frequency of 100 kHz (top photo); a frequency modulated waveform disturbance having a carrier frequency of 100 kHz and a modulating frequency of 10 kHz of a relatively strong modulation depth (second from top photo); a frequency modulated waveform disturbance having a carrier frequency of 100 kHz and a modulating frequency of 10 kHz of a relatively weak modulation depth (third from top photo); a frequency modulated waveform disturbance having a carrier frequency of 100 kHz and a to modulating frequency of 15 kHz (fourth from top photo), a frequency modulated waveform disturbance having a carrier frequency of 100 kHz and a modulating frequency of 20 kHz (bottom photo).

These photographs indicate that tin droplets having a diameter of about 265 μm can be produced that are spaced-apart by about 3.14 mm, a spacing which cannot be realized at this droplet size and repetition rate using a single frequency, non-modulated waveform disturbance.

Measurements indicated a timing jitter of about 0.14% of a modulation period which is substantially less than the jitter observed under similar conditions using a single frequency, non-modulated waveform disturbance. This effect is achieved because the individual droplet instabilities are averaged over a number of coalescing droplets.

With reference now to FIGS. 9-12, Applicants have determined that in addition to the modulated, e.g., multiple frequency, disturbance waveforms described above, other waveforms may be used to produce coalescing droplet streams that can be controlled to produce a stable stream of coalesced droplets below the frequency minimum that would otherwise limit stable droplet production using single frequency sinusoidal non-modulated waveform disturbances.

Specifically, these waveforms may produce a disturbance in the fluid which generates a stream of droplets having differing initial velocities within the stream that are controlled, predictable, repeatable and/or non-random.

For example, for a droplet generator producing a disturbance using an electro-actuatable element, a series of pulse waveforms may be used with each pulse having sufficiently short rise-time and/or fall-time compared to the length of the waveform period to generate a fundamental frequency within an operable response range of the electro-actuatable element, and at least one harmonic of the fundamental frequency.

As used herein, the term fundamental frequency, and its derivatives and equivalents, means a frequency disturbing a fluid flowing to an outlet orifice and/or a frequency applied to a sub-system generating droplets, such as a nozzle, having an electro-actuatable element producing a disturbance in the fluid; to produce a stream of droplets, such that if the droplets in the stream are allowed to fully coalesce into a pattern of equally-spaced droplets, there would be one fully coalesced droplet per period of the fundamental frequency.

Figure 15A:
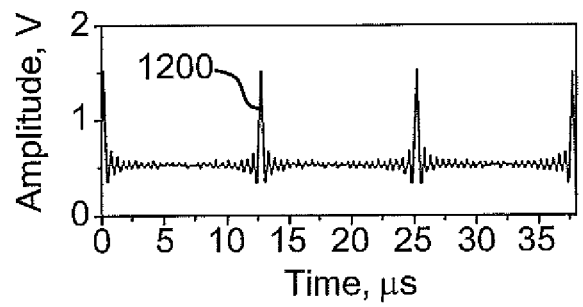
FIGS. 15A-D show experimental results for a sine function wave (FIG. 15A) modulation, including a frequency spectrum (FIG. 15B) for a sine function wave; an image of droplets taken at 20 mm from the output orifice (FIG. 15C) and an image of coalesced droplets taken at 450 mm from the output orifice (FIG. 15D).

Examples of suitable pulse waveforms include, but are not necessarily limited to, a square wave (FIG. 9), rectangular wave, and peaked-nonsinusoidal waves having sufficiently short rise-time and/or fall-time, such as a fast pulse (FIG. 13A), fast ramp wave (FIG. 14A) and a sine function wave (FIG. 15A).

Figure 9:
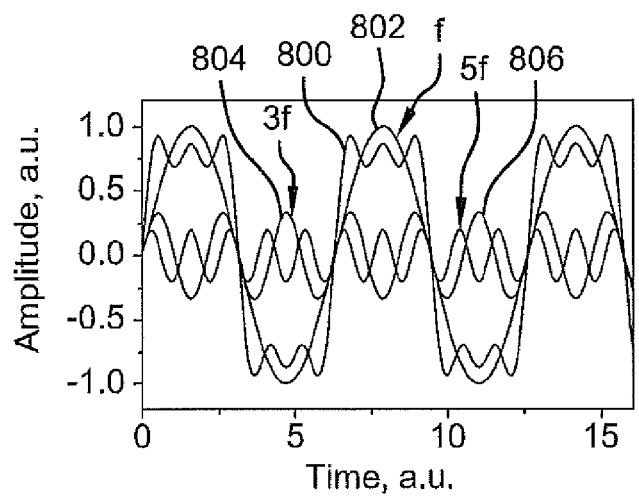
FIG. 9 shows a representation of a square wave as a superposition of odd harmonics of a sine wave signal.

FIG. 9 shows a representation of a square wave 800 as a superposition of odd harmonics of a sine wave signal. Note: only the first two harmonics of the frequency f are shown for simplicity. It is to be appreciated that an exact square wave shape would be obtained with an infinite number of odd harmonics with progressively smaller amplitudes. In more detail, a square wave 800 can be mathematically represented as a combination of sine waves with fundamental frequency, f, (waveform 802) of the square wave and its higher order odd harmonics, 3f, (waveform 804), 5f (waveform 806); and so on:

$$v(t) = \frac{4}{\pi}\left(\sin(\omega t) + \frac{1}{3}\sin(3\omega t) + \frac{1}{5}\sin(5\omega t) + \frac{1}{7}\sin(7\omega t) + ...\right)$$

where t is time, v(t) is the instantaneous amplitude of the wave (i.e. voltage), and ω is the angular frequency. Thus, applying a square wave signal to an electro-actuatable element, e.g., piezoelectric, may result in mechanical vibrations at the fundamental frequency f=ω/2π, as well as higher harmonics of this frequency 3f, 5f, etc. This is possible due to the limited and, in general case, highly non-uniform frequency response of a droplet generator employing an electro-actuatable element. If the fundamental frequency of the square wave signal significantly exceeds the limiting value of $0.3\upsilon/(\pi d)$, then the formation of single droplets at this frequency is effectively prohibited and the droplets are generated at the higher harmonics. As in the case of the amplitude and frequency modulation described above, droplets produced with a square wave signal have differential velocities, relative to adjacent droplets in the stream, that lead to their eventual coalescence into larger droplets with a frequency f. In some implementations, the EUV light source is configured such that a plurality of droplets are produced per period, with each droplet having a different initial velocity than a subsequent droplet, such that: 1) at least two droplets coalesce before reaching the irradiation site; or 2) the droplets produce a desired pattern such as a pattern which includes closely-spaced, droplet doublets.

Figure 10:
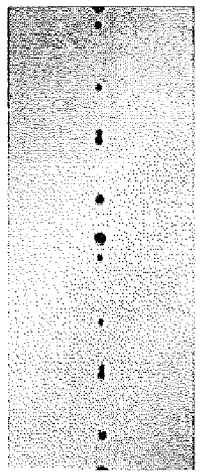
FIG. 10 shows images of droplets obtained with a square wave modulation at 30 kHz taken at ~40 mm from the output orifice.
Figure 11:
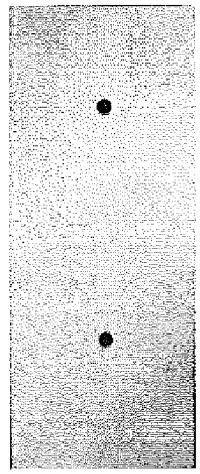
FIG. 11 shows images of droplets obtained with a square wave modulation at 30 kHz taken at ~120 mm from the output orifice.

FIGS. 10 and 11 show images of droplets obtained with a square wave modulation at 30 kHz. With a simple sine wave modulation, the lowest modulation frequency where a single droplet per period can be obtained for the droplet generator used in this experiment was 110 kHz. The image shown in FIG. 10 was taken at ~40 mm from the output orifice and the image shown in FIG. 11 was taken later at ~120 mm from the output orifice where the droplets are already coalesced. This example demonstrates the advantage of using a square wave modulation to obtain droplets at a frequency lower than the natural, low-frequency limit of a particular droplet generator configuration.

Similar arguments can be applied to a variety of repetitive modulation signals with multiple harmonics having short rise-time and/or fall-time including, but not limited to, a fast pulse (FIG. 13A), fast ramp wave (FIG. 14A) and a sine function wave (FIG. 15A). For instance, a sawtooth waveform contains not only odd, but also even harmonics of the fundamental frequency, and therefore, can also be effectively used for overcoming the low frequency modulation limit and improving stability of a droplet generator. In some cases, a specific droplet generator configuration may be more responsive to some frequencies than others. In this case, a waveform which generates a large number of frequencies is more likely to include a frequency which matches the response frequency of the particular droplet generator.

Figure 12C:
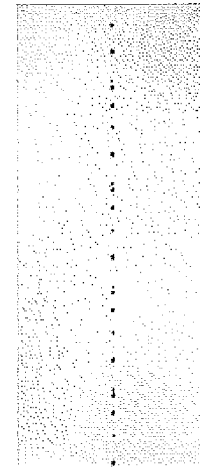
FIGS. 12A-D show experimental results for a rectangular wave (FIG. 12A) modulation, including a frequency spectrum (FIG. 12B) for a rectangular wave; an image of droplets taken at 20 mm from the output orifice (FIG. 12C) and an image of coalesced droplets taken at 450 mm from the output orifice (FIG. 12D)
Figure 12D:
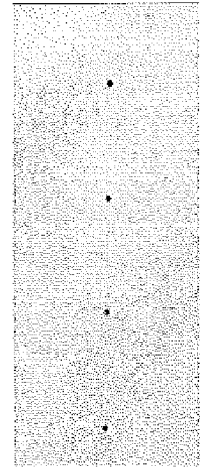
Figure 12A:
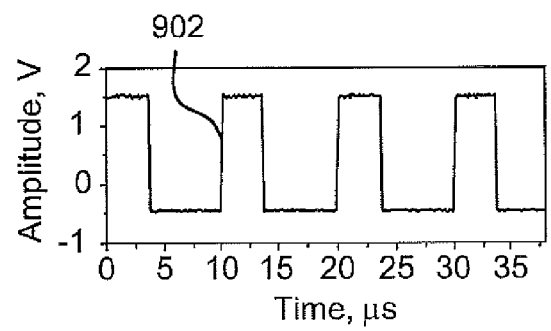
Figure 12B:
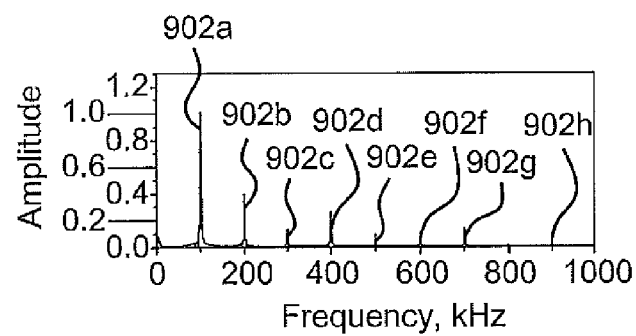

FIG. 12A shows a rectangular wave 902 for driving a droplet generator and FIG. 12B shows a corresponding frequency spectrum having fundamental frequency 902a and harmonics 902b-h of various magnitudes for a period of the rectangular wave. FIG. 12C shows an image of droplets taken at 20 mm from the output orifice of the droplet generator driven by the rectangular wave and shows droplets beginning to coalesce. FIG. 12D shows an image of droplets taken at 450 mm from the output orifice after the droplets have fully coalesced.

FIG. 13A shows a series of fast pulses 1000 for driving a droplet generator and FIG. 13B shows a corresponding frequency spectrum having fundamental frequency 1002a and harmonics 1002b-i of various magnitudes for a single fast pulse. FIG. 13C shows an image of droplets taken at 20 mm from the output orifice of the droplet generator driven by the series of fast pulses and shows droplets beginning to coalesce. FIG. 13D shows an image of droplets taken at 450 mm from the output orifice after the droplets have fully coalesced.

FIG. 14A shows a fast ramp wave 1100 for driving a droplet generator and FIG. 14B shows a corresponding frequency spectrum having fundamental frequency 1102a and harmonics 1102b-p of various magnitudes for a single fast pulse wave period. FIG. 14C shows an image of droplets taken at 20 mm from the output orifice of the droplet generator driven by the fast ramp wave and shows droplets beginning to coalesce. FIG. 14D shows an image of droplets taken at 450 mm from the output orifice after the droplets have fully coalesced.

Figure 15B:
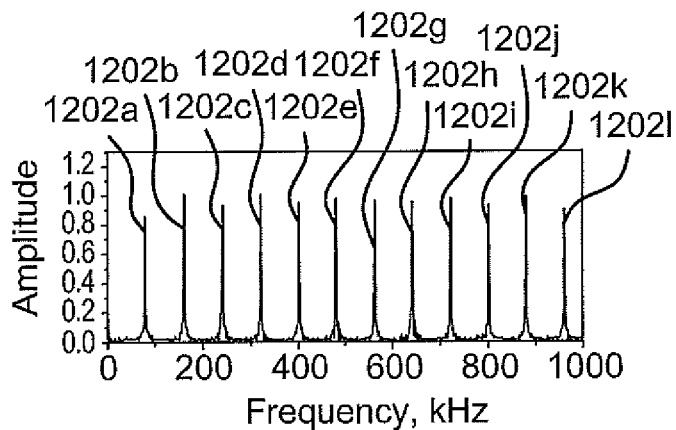
Figures 15C, 15D:
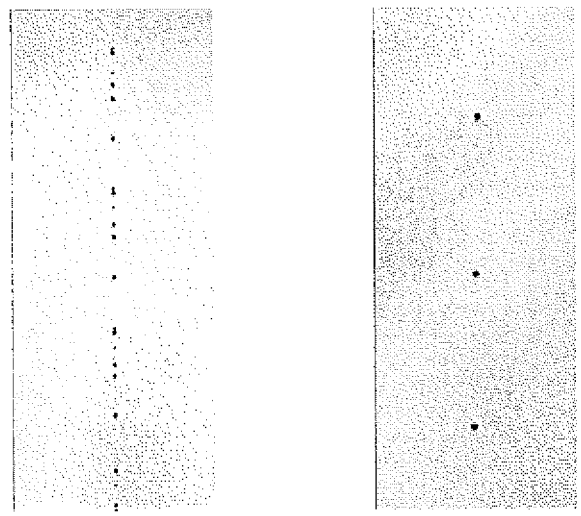

FIG. 15A shows a sine function wave 1200 for driving a droplet generator and FIG. 15B shows a corresponding frequency spectrum having fundamental frequency 1202a and harmonics 1202b-1 of various magnitudes for a single sine function wave period. FIG. 15C shows an image of droplets taken at 20 mm from the output orifice of the droplet generator driven by the sine function wave and shows droplets beginning to coalesce. FIG. 15D shows an image of droplets taken at 450 mm from the output orifice after the droplets have fully coalesced.

Figure 16:
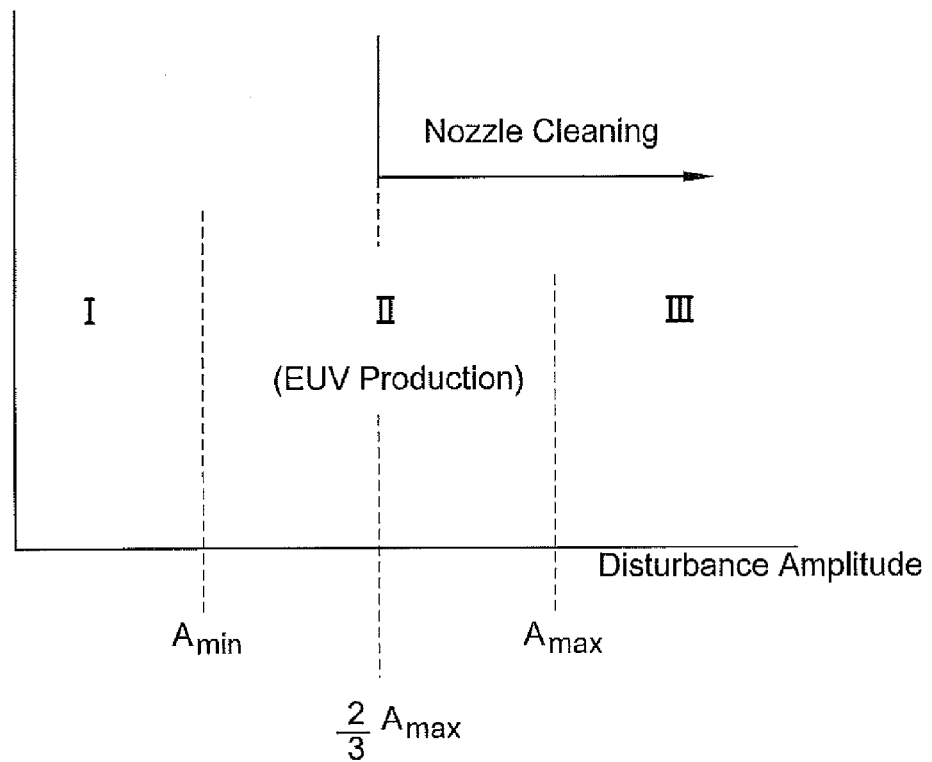
FIG. 16 shows a graph illustrating disturbance peak amplitude regions for a droplet generator such as the droplet generator shown in FIG. 3.

FIG. 16 shows a graph illustrating disturbance peak amplitude regions for a droplet generator, such as the droplet generator shown in FIG. 3 (see definition of peak amplitude below). For disturbances with peak amplitudes below about $A_{min}$ (region I), Applicants have noticed that droplet coalescence is insufficient to produce droplets that have fully coalesced prior to reaching an irradiation site. Also, at the low end of this region, the disturbance may not be sufficient to overcome noise resulting in random droplet formation. In region II, (disturbances with peak amplitudes above about $A_{min}$ and below about $A_{max}$), Applicants have noticed that droplet coalescence is sufficient to produce droplets that have fully coalesced prior to reaching an irradiation site, and that droplet pointing is stable as long as the orifice remains unclogged. Applicants consider region II to be acceptable to produce droplets for irradiation to produce an output EUV beam. In region III, (disturbances with peak amplitudes above about $A_{max}$), Applicants have noticed that droplet pointing is unstable, even if the orifice remains unclogged. Applicants consider region III to be unacceptable to produce droplets for irradiation to produce an output EUV beam due to unstable pointing.

FIG. 16 also indicates that for disturbances with a peak amplitude above about $\frac{2}{3} A_{max}$, Applicants have noticed that more than an insubstantial amount of actuator-induced nozzle cleaning may occur, dislodging deposits that have accumulated at or near the nozzle orifice. Specifically, as further explained below, Applicants have applied disturbances with peak amplitudes above about $\frac{2}{3} A_{max}$, to dislodge contaminants and recover acceptable pointing stability in droplet generators that have become partially clogged.

Figure 17A:
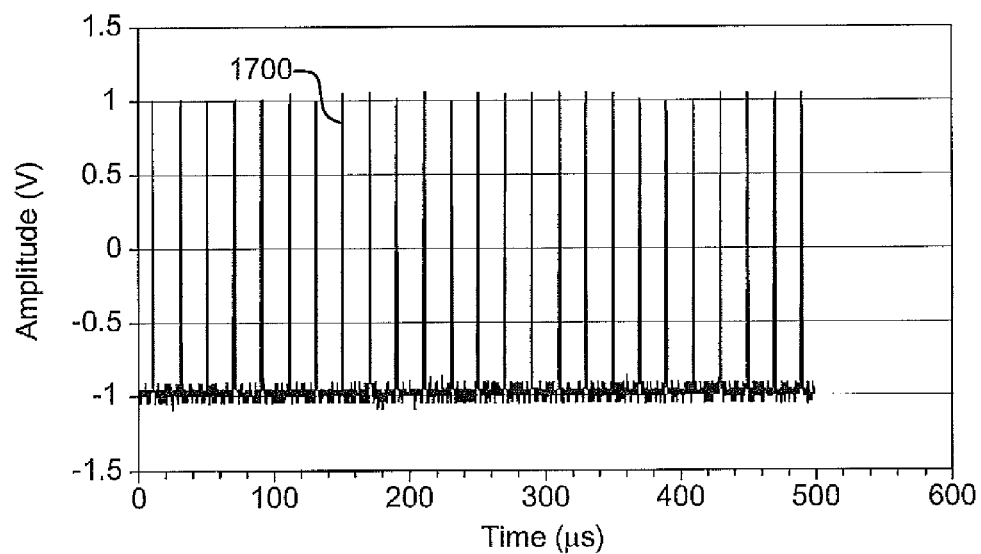
FIG. 17A shows a periodic waveform having a substantially rectangular periodic shape a finite rise-time, period of about 20 μs, a periodic frequency of 50 kHz, and a peak amplitude of about 2V for driving an electro-actuator to produce a disturbance in a fluid.

FIG. 17A shows a periodic waveform 1700 having a substantially rectangular periodic shape for driving an electro-actuator to produce a disturbance in a fluid. The periodic waveform 1700 has a finite rise-time, period of about 20 μs, a periodic frequency of 50 kHz and a peak amplitude of about 2V. For example, the waveform 1700 represents a waveform that can be measured using an oscilloscope connected across the terminals where the signal from a signal generator is input to an electro-actuatable element, such as the electro-actuatable element 150, shown in FIG. 3.

As used herein, the term "peak amplitude" and its derivatives means the maximum instantaneous amplitude minus the minimum instantaneous amplitude. Thus, for the waveform shown in FIG. 17A having amplitude measured in volts, the peak amplitude is 1.0V minus −1.0V=2.0V. Similarly, for a periodic disturbance, the peak amplitude is calculated as the maximum instantaneous disturbance amplitude minus the minimum instantaneous disturbance amplitude.

Figure 17B:
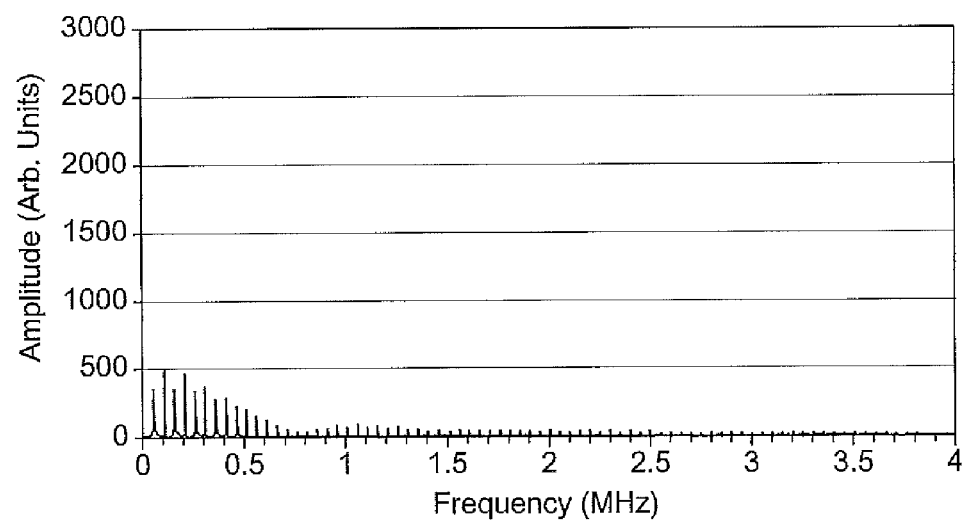
FIG. 17B shows a frequency spectrum of the waveform shown in FIG. 17A.

FIG. 17B shows a Fourier transform (frequency spectrum) of the waveform 1700. Applicants have applied the waveform of FIG. 17A to a droplet generator with the arrangement shown in FIG. 3, and found that the waveform with peak amplitude of about 2V corresponded to $A_{min}$ in on the graph of FIG. 16, in that the peak amplitude (2V) was on the low end of peak amplitudes that are suitable for generating droplets for producing an EUV output. Applicants also found that a waveform with peak amplitude of about 6V corresponded to $A_{max}$ on the graph of FIG. 16, in that the peak amplitude (6V) was on the high end of peak amplitudes that are suitable for generating droplets for producing an EUV output.

Figure 18A:
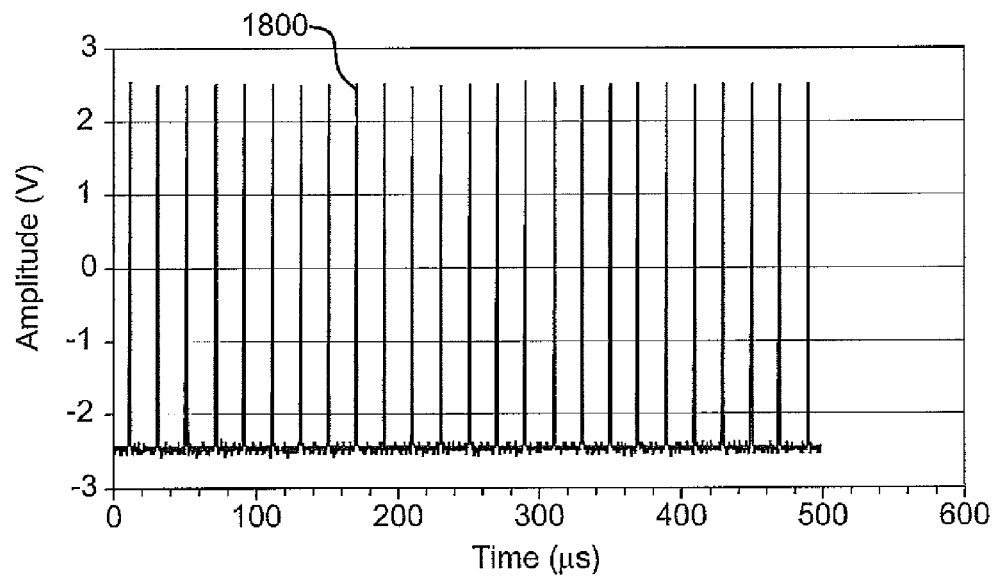
FIG. 18A shows a periodic waveform having a substantially rectangular periodic shape a finite rise-time, period of about 20 μs, a periodic frequency of 50 kHz, and a peak amplitude of about 5V for driving an electro-actuator to produce a disturbance in a fluid.
Figure 18B:
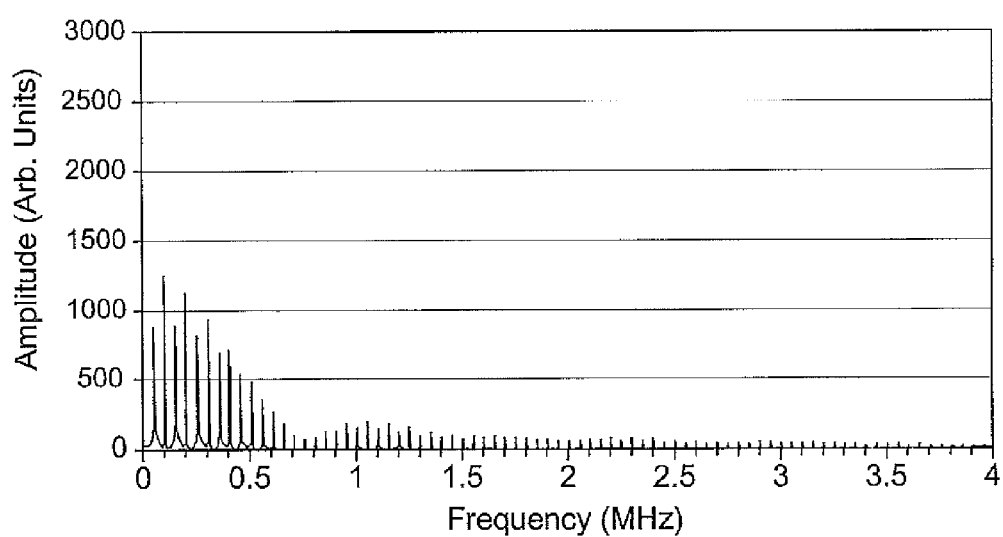
FIG. 18B shows a frequency spectrum of the waveform shown in FIG. 18A.

FIG. 18A shows a periodic waveform 1800 having a substantially rectangular periodic shape for driving an electro-actuator to produce a disturbance in a fluid. The periodic waveform 1800 has the same finite rise time as periodic waveform 1700 shown in FIG. 17A, a period of about 20 μs, a periodic frequency of 50 kHz and peak amplitude of about 5V. For example, the waveform 1800 represents a waveform that can be measured using an oscilloscope connected across the terminals, where the signal from a signal generator is input to an electro-actuatable element, such as the electro-actuatable element 150 shown in FIG. 3. FIG. 18B shows a Fourier transform, (frequency spectrum) of the waveform 1800. Applicants have applied the waveform of FIG. 18A to a droplet generator with the arrangement shown in FIG. 3, and found that the waveform with peak amplitude of about 5V was within the range of peak amplitudes that are suitable for generating droplets for producing an EUV output, and could be used to dislodge deposits that have accumulated at or near the nozzle orifice and recover acceptable pointing stability in droplet generators that have become partially clogged.

Comparing the frequency spectrum shown in FIG. 18B to the frequency spectrum shown in FIG. 17B, it can be seen the increasing the peak amplitude of the waveform used to drive the electro-actuatable element (FIG. 18B), significantly increases the amplitude of the fundamental frequency, in this case 50 kHz, and the higher harmonics.

Figure 19A:
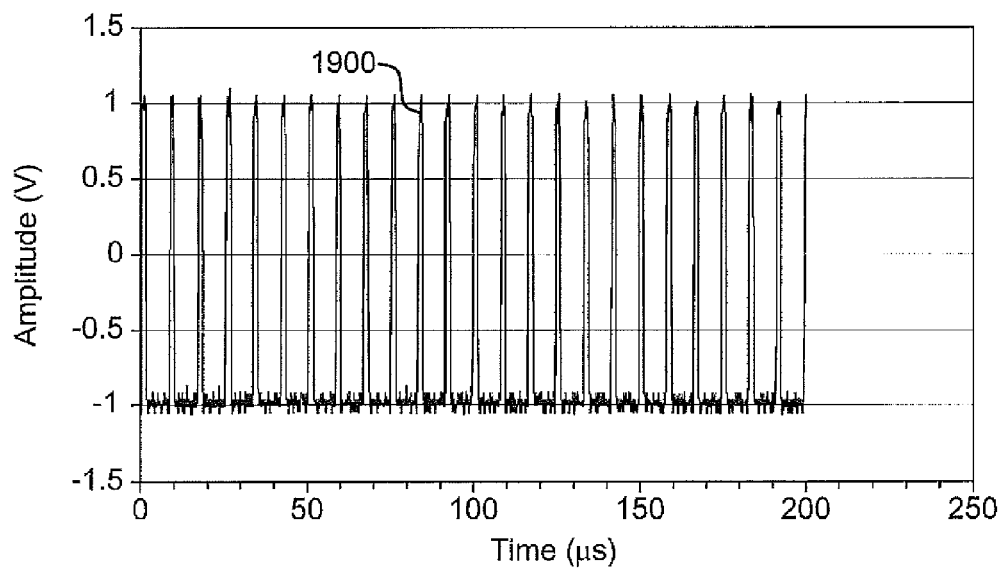
FIG. 19A shows a periodic waveform having a substantially rectangular periodic shape a finite rise-time, period of about 20 μs, a periodic frequency of 120 kHz, and a peak amplitude of about 2V for driving an electro-actuator to produce a disturbance in a fluid.
Figure 19B:
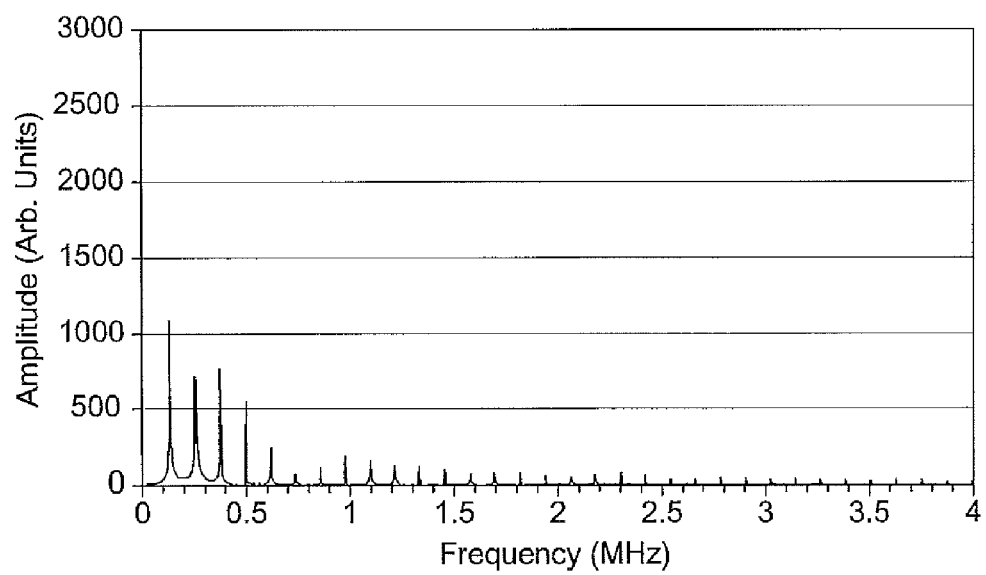
FIG. 19B shows a frequency spectrum of the waveform shown in FIG. 19A.

FIG. 19A shows a periodic waveform 1900 having a substantially rectangular periodic shape for driving an electro-actuator to produce a disturbance in a fluid. The periodic waveform 1900 has the same finite rise time as periodic waveform 1700 shown in FIG. 17A, a period of about 8.33 μs, a periodic frequency of 120 kHz and peak amplitude of about 2V. For example, the waveform 1900 represents a waveform that can be measured using an oscilloscope connected across the terminals, where the signal from a signal generator is input to an electro-actuatable element, such as the electro-actuatable element 150 shown in FIG. 3. FIG. 19B shows a Fourier transform (frequency spectrum) of the waveform 1900. Applicants have applied the waveform of FIG. 19A to a droplet generator with the arrangement shown in FIG. 3, and found that the waveform with peak amplitude about 2V and periodic frequency of 120 kHz could be used to dislodge deposits that have accumulated at or near the nozzle orifice, and recover acceptable pointing stability in droplet generators that have become partially clogged.

Comparing the frequency spectrum shown in FIG. 19B to the frequency spectrum shown in FIG. 17B it can be seen that increasing the periodic frequency of the waveform used to drive the electro-actuatable element (FIG. 19B), significantly increases the amplitude of the frequencies above the fundamental frequency for the FIG. 17A waveform (50 kHz).

Figure 20A:
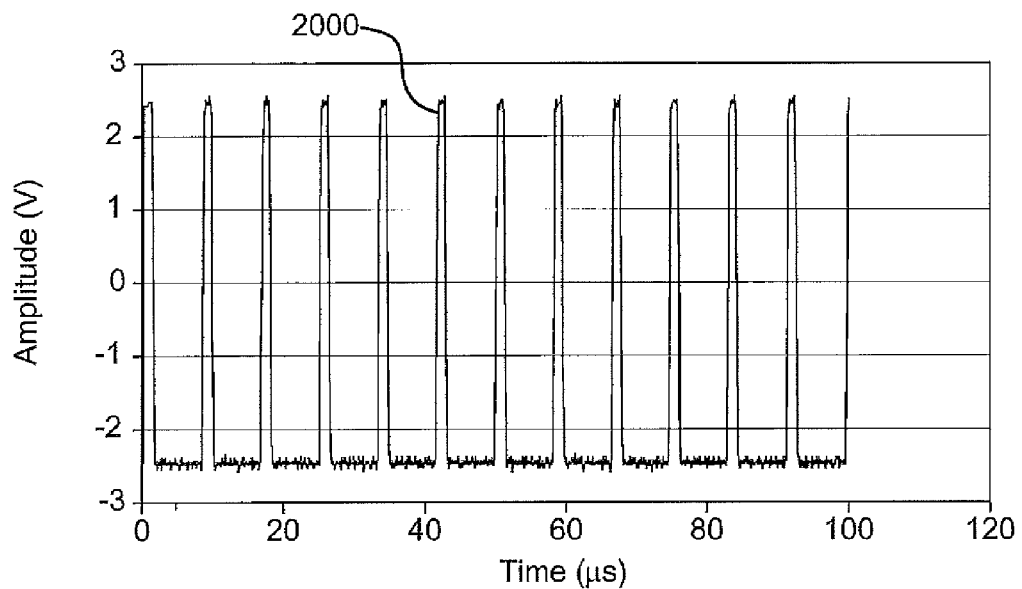
FIG. 20A shows a periodic waveform having a substantially rectangular periodic shape a finite rise-time, period of about 20 μs, a periodic frequency of 120 kHz, and a peak amplitude of about 5V for driving an electro-actuator to produce a disturbance in a fluid.
Figure 20B:
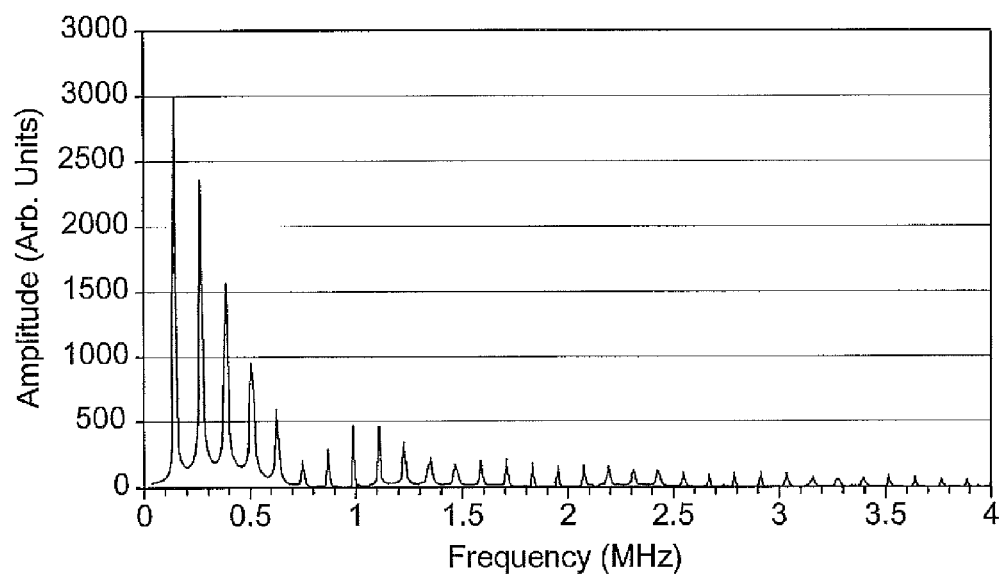
FIG. 20B shows a frequency spectrum of the waveform shown in FIG. 20A.

FIG. 20A shows a periodic waveform 2000 having a substantially rectangular periodic shape for driving an electro-actuator to produce a disturbance in a fluid. As shown, the periodic waveform 2000 has the same finite rise time as periodic waveform 1700 shown in FIG. 17A, a period of about 8.33 μs, a periodic frequency of 120 kHz and peak amplitude of about 5V. For example, the waveform 2000 represents a waveform that can be measured using an oscilloscope connected across the terminals where the signal from a signal generator is input to an electro-actuatable element, such as the electro-actuatable element 150, shown in FIG. 3. FIG. 20B shows a Fourier transform (frequency spectrum) of the waveform 2000. Applicants have applied the waveform of FIG. 20A to a droplet generator with the arrangement shown in FIG. 3, and found that the waveform with peak amplitude of bout 5V, and periodic frequency of 120 kHz could be used to dislodge deposits that have accumulated at or near the nozzle orifice, and recover acceptable pointing stability in droplet generators that have become partially clogged.

Comparing the frequency spectrum shown in FIG. 20B to the frequency spectrum shown in FIG. 17B, it can be seen that increasing the periodic frequency of the waveform used to drive the electro-actuatable element (FIG. 20A) significantly increases the amplitude of the frequencies above the fundamental frequency for the FIG. 17A waveform (50 kHz).

Figure 21:
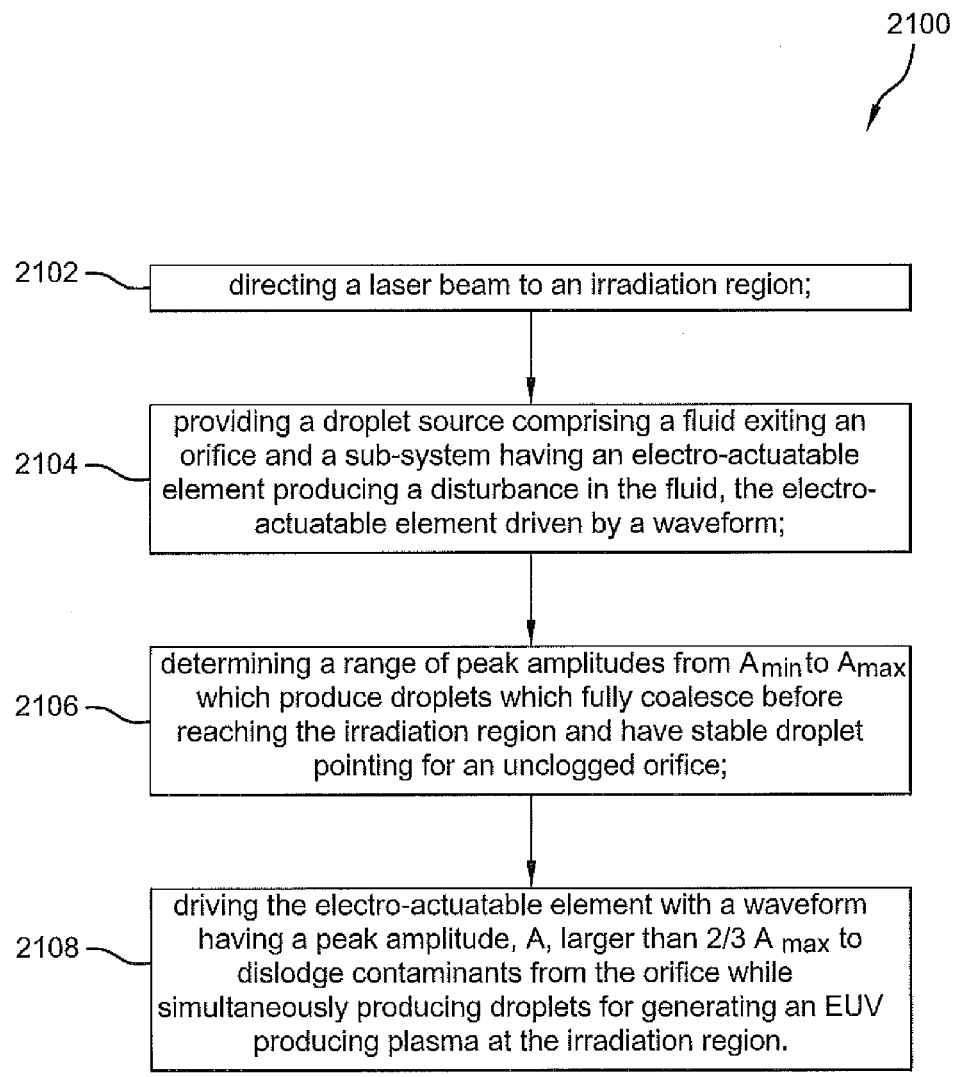
FIG. 21 is a flowchart showing a process that can be used to determine a waveform for driving an electro-actuatable element for simultaneously producing droplets suitable for generating an EUV producing plasma at an irradiation region and dislodging contaminants from a nozzle orifice.

FIG. 21 is a flowchart showing a process 2100 that can be used to determine a waveform for driving an electro-actuatable element for simultaneously producing droplets suitable for generating an EUV producing plasma at an irradiation region and dislodging contaminants from a nozzle orifice. As shown in FIG. 21, the process 2100 may include directing a laser beam to an irradiation region (Box 2102) and providing a droplet source comprising a fluid exiting an orifice and a sub-system having an electro-actuatable element producing a disturbance in the fluid, the electro-actuatable element driven by a waveform (Box 2104). For example, the droplet source may include one of the configurations shown in FIG. 2, 2A, 2B, 2C or 3. The waveform may be produced by a signal generator and transmitted via electrical cables to the electro-actuatable element, and may, for example, be measured using an oscilloscope across the terminals where the cables connect to the electro-actuatable element.

Next, as shown in Box 2106, a range of peak amplitudes from $A_{min}$ to $A_{max}$ which produce droplets which fully coalesce before reaching the irradiation region and have stable droplet pointing for an unclogged orifice may be determined. For example, with the setup described above, the output of the signal generator may be incrementally adjusted to produce driving waveforms (measured at the oscilloscope) having increased peak amplitudes (without varying waveform shape or periodic frequency) while observing the resultant droplet streams. Specifically, droplet coalescence and pointing stability may be observed. Beginning at a relatively low peak amplitude, random droplet formation due to noise may be observed. With increasing peak amplitude, relatively weak droplet coalescence may be observed that is insufficient to cause droplets to fully coalesce before reaching the irradiation region (region I of FIG. 16). With still further increases in peak amplitude, droplet coalescence may be observed sufficient to cause droplets to fully coalesce before reaching the irradiation region. The minimum peak amplitude, $A_{min}$, at which full coalescence occurs may depend on the distance between the nozzle orifice and the irradiation region. Increasing the peak amplitude within the range from $A_{min}$ to $A_{max}$ continues to produce droplets which fully coalesce before reaching the irradiation zone and have stable droplet pointing as long as the orifice remains unclogged (region II of FIG. 16). At peak amplitudes greater than about $A_{max}$, (region III of FIG. 16), Applicants have noticed that droplet pointing is unstable, even if the orifice remains unclogged. Specifically, in some tests, Applicants have noticed that after only a few hours of droplet generation, droplet pointing becomes unstable.

Once the range of peak amplitudes from $A_{min}$ to $A_{max}$ which produce droplets which fully coalesce before reaching the irradiation region and have stable droplet pointing for an unclogged orifice has been determined, box 2108 shows that the next step may be to drive the electro-actuatable element with a waveform having a peak amplitude, A, larger than about $\tfrac{2}{3} A_{max}$ and less $A_{max}$ to produce droplets for generating an EUV producing plasma at the irradiation region. Within this range, Applicants believe that actuator induced nozzle cleaning occurs which may dislodge contaminants that have deposited at or near the nozzle orifice. The actuator-induced nozzle cleaning may occur, for example, due to the increased amplitude of the higher frequencies (i.e. frequencies above the fundamental frequency, as shown in FIG. 18B.

Figure 22:
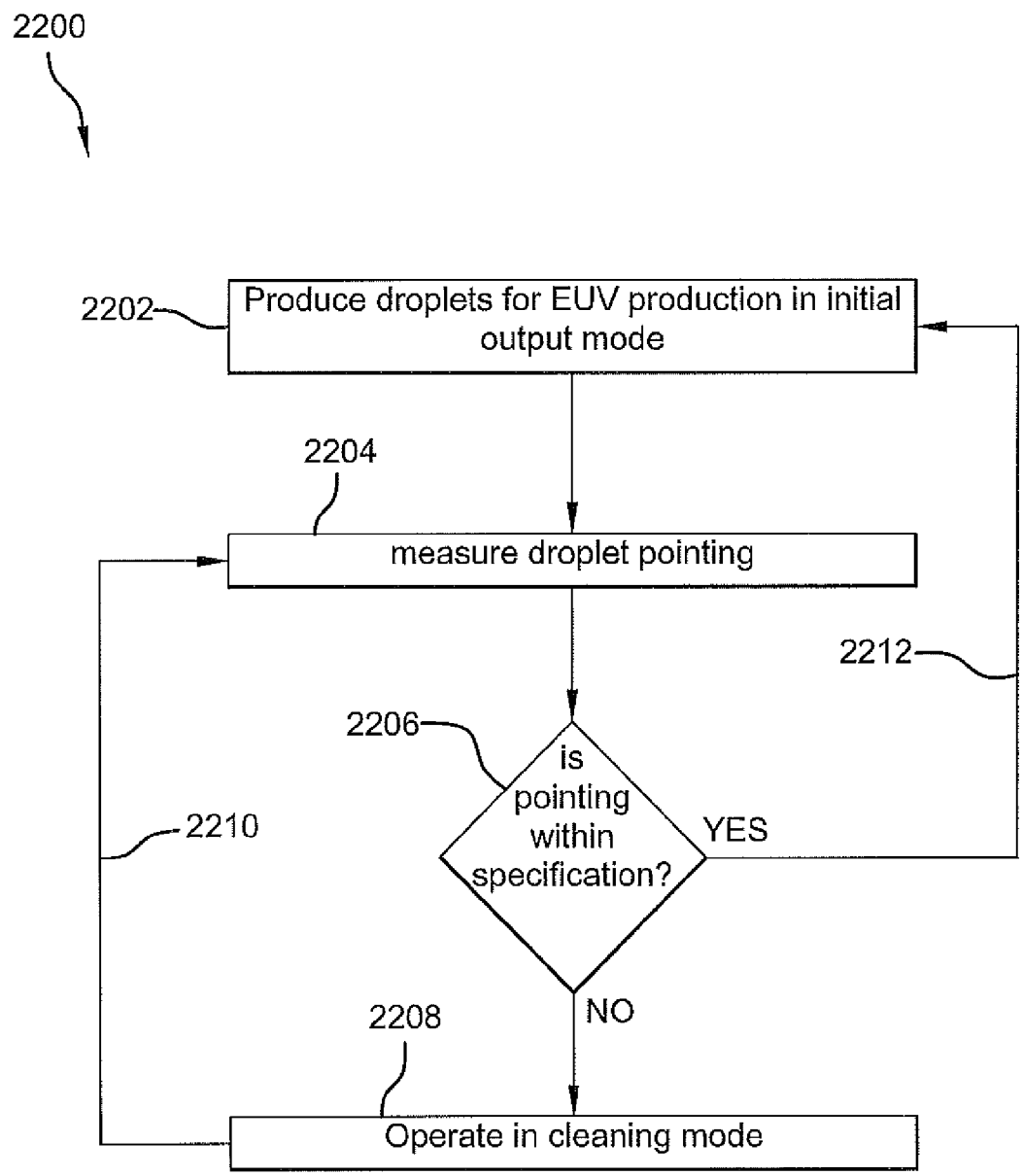
FIG. 22 is a flowchart showing a process that can be used to produce droplets for irradiation to produce an EUV output while periodically driving the electro-actuatable element of a droplet generator with a waveform that causes actuator induced nozzle cleaning.

FIG. 22 is a flowchart showing a process 2200 that can be used to produce droplets for irradiation to produce an EUV output (initial output mode) while periodically driving the electro-actuatable element of a droplet generator with a waveform that causes more than an insubstantial amount of actuator-induced nozzle cleaning (cleaning mode). As shown, the process 2200 begins by driving the electro-actuatable element of a droplet generator with a waveform that produces droplets for EUV production (Box 2202). This may be, for example, a periodic waveform having a substantially rectangular periodic shape having a finite rise-time and a periodic frequency between 40-100 kHz and a peak amplitude of between 2-6V. Alternatively, one of the other waveform shapes described above may be suitable for producing droplets for irradiation to produce an EUV output, such as a square wave, a peaked-non-sinusoidal wave, such as a fast pulse waveform, a fast ramp waveform or a sine function waveform, or a modulated waveform, such as a frequency modulated waveform or an amplitude modulated waveform.

With a stream of droplets, Box 2204 indicates that droplet pointing may be measured. For example, the position of one or more droplets in the stream may be determined relative to a desired axis. As indicated above, droplet position may be determined using a droplet imager, such as a camera or a light source, such as a semiconductor laser may direct a beam through the droplet stream path to a detector, such as a photodetector array, avalanche photodiode or photomultiplier which then outputs a signal indicative of droplet position. Droplet position may be determined in one or more axes. For example, defining the desired pointing path as the X axis, droplet position may be measured as a distance from the X axis in the Y axis, and droplet position may be measured as a distance from the X axis in the Z axis. In some cases, the positions of several droplets may be averaged, a standard deviation may be calculated and/or some other calculation may be made to determine a value indicative of position. This value may then be compared to a position specification which is established for the EUV light source to determine if droplet pointing is acceptable. The specification along the Y axis may be different than the specification along the Z axis. Distances may be measured at a location along the droplet path between the droplet generator output and the irradiation region. Standard deviations may be calculated for both Y and Z axis and then compared to a specification. For example, a standard deviation specification of about 4-10 μm (for measurements near or at the irradiation region) may be used for some light sources. The specification may have multiple levels. Droplet pointing may be measured during an EUV output burst when droplets are irradiated by a laser beam, during an intervening period, or both.

FIG. 22 indicates that if pointing is within specification (Box 2206) droplets may continue to be produced for irradiation to produce an EUV output using the initial output mode. On the other hand, if pointing is outside a specification (Box 2206) the droplet generator may be operated in a cleaning mode (Box 2208). During cleaning mode operation, line 2210 shows that droplet pointing may continue to be measured (Box 2204). If the droplet pointing recovers to within specification (line 2212) the droplet generator may be operated in the initial output mode (Box 2202).

The waveform used to drive the electro-actuatable element of the droplet generator in cleaning mode may be different from the waveform used for the initial output mode that produces droplets for EUV production (Box 2202). For example, the waveform used in cleaning mode may have a different periodic shape, periodic frequency and/or peak amplitude, than the waveform used in the initial output mode.

For example, the cleaning mode waveform may be a periodic waveform having a substantially rectangular periodic shape having a finite rise-time and a periodic frequency greater than about 100 kHz. In one implementation, both the initial output mode waveform and cleaning mode waveform may be a periodic waveform having a substantially rectangular periodic shape having a finite rise-time, with the initial output mode waveform having a periodic frequency less than about 100 kHz and the cleaning mode waveform having a periodic frequency greater than about 100 kHz. The peak amplitude of the two waveforms may be the same or different. In some cases, periodic frequency of the initial output mode waveform may be constrained by other system parameters, such as a maximum drive laser pulse repetition rate or some other system parameter.

Comparing the frequency spectrum shown in FIG. 20B to the frequency spectrum shown in FIG. 17B it can be seen that increasing the periodic frequency of the waveform used to drive the electro-actuatable element (FIG. 20A) significantly increases the amplitude of the frequencies above the fundamental frequency for the FIG. 17A waveform (50 kHz). As indicated above, actuator-induced nozzle cleaning may occur, for example, due to an increased amplitude of the higher frequencies.

In another implementation, both the initial output mode waveform and cleaning mode waveform may be a periodic waveform having a substantially rectangular periodic shape having a finite rise-time, with the initial output mode waveform having a peak amplitude within the range $A_{min}$ to $A_{max}$ (as described above with reference to FIG. 16), the cleaning mode waveform having a peak amplitude larger than about $\frac{2}{3} A_{max}$, and the cleaning mode waveform having a peak amplitude larger than the initial output mode waveform peak amplitude. The periodic frequency of the two waveforms may be the same or different. Droplets produced during cleaning mode may be suitable for irradiation to produce an BUY output, for example, if the peak amplitude used for cleaning mode is between about $\frac{2}{3} A_{max}$ and $A_{max}$. Thus, is some cases, changing from the initial output mode to cleaning mode can occur without reducing EUV light output. In other cases, droplets produced during cleaning mode may be unsuitable for irradiation to produce an EUV output, for example, if the peak amplitude used for cleaning mode is larger than $A_{max}$.

Comparing the frequency spectrum shown in FIG. 18B to the frequency spectrum shown in FIG. 17B it can be seen that increasing the peak amplitude of the waveform used to drive the electro-actuatable element (FIG. 18A) significantly increases the amplitude of the frequencies above the fundamental frequency of the FIG. 17A waveform (50 kHz). As indicated above, actuator-induced nozzle cleaning may occur, for example, due to an increased amplitude of these higher frequencies.

Alternatively, one of the other waveform shapes described above may be suitable as a cleaning mode waveform such as a sinusoidal wave, square wave, a peaked-non-sinusoidal wave such as a fast pulse waveform, a fast ramp waveform or a sine function waveform, or a modulated waveform, such as a frequency modulated waveform, or an amplitude modulated waveform.

If a pointing measurement indicates that pointing is outside a specification, the droplet generator may continue to produce droplets in the initial output mode until a suitable intervening period occurs, such as a period between exposure fields, a period when the exposure tool changes wafers, a period when the exposure tool swaps out a so-called "boat" or cassette which holds a number of wafers, or a period when the exposure tool or light source performs metrology, performs one or more maintenance functions, or performs some other scheduled or unscheduled process.

During a suitable intervening period, the droplet generator may be placed in cleaning mode. As indicated above, the cleaning mode waveform may also be suitable to produce droplets for EUV production. For this case, the droplet generator may continue to use the cleaning mode waveform to produce droplets for the next burst of output EUV pulses. Also indicated above, the cleaning mode waveform may not produce droplets that are suitable to produce droplets for EUV production. In this case, the droplet generator mode may be changed from cleaning mode to the initial output mode prior to producing droplets for the next burst of output EUV pulses. Alternatively, the droplet generator mode may be changed from cleaning mode to another output mode, different from the initial output mode prior to producing droplets for the next burst of output EUV pulses. For example, the initial output mode may use a waveform with peak amplitude of 2V for initial output mode, a waveform with peak amplitude of 10V for cleaning mode and a waveform with peak amplitude of 5V for a burst following an intervening period in which the droplet generator was placed in cleaning mode.

As indicated above, two or more specification levels may be employed. For example, if droplet pointing exceeds a first specification level, transition to a cleaning mode may be indicated, but may be delayed to a particular type of intervening period. If pointing exceeds a second specification level, cleaning mode may be triggered sooner, or, in some cases, immediately. Alternatively, the amount of droplet pointing error may determine the type of cleaning mode that is employed. For example, if measured droplet pointing is outside of a first specification, for example, a control algorithm may be used to place the droplet generator in cleaning mode at the next suitable intervening period with a cleaning mode waveform that is also suitable to produce droplets for EUV production. On the other hand, if measured droplet pointing is outside of a second specification, for example, a control algorithm may be used to place the droplet generator in cleaning mode at the next suitable intervening period with cleaning mode waveform that is not suitable to produce droplets for EUV production. For example, the initial output mode may use a waveform with peak amplitude of 2V for initial output mode, a waveform with peak amplitude of 5V for cleaning mode after measured droplet pointing is outside of a first specification, and a waveform with peak amplitude of 10V after measured droplet pointing is outside of a second specification.

In some arrangements, the droplet generator may be placed in cleaning mode during an intervening period without measuring droplet pointing or without a droplet pointing measurement that falls outside a system specification. For example, the droplet generator may be placed into cleaning mode, for example, via control algorithm on a periodic schedule, for example, every suitable intervening period, every other suitable intervening period, etc. Alternatively, another parameter may be measured and used to determine whether the droplet generator is placed into cleaning mode at the next suitable intervening period. For example a parameter indicative of droplet-laser alignment such as output EUV, EUV conversion efficiency or angular EUV intensity distribution may be used.

In another implementation, the periodic frequency of the cleaning waveform may be changed during a cleaning mode period. For example, the periodic frequency may be swept through a range of periodic frequencies. By sweeping through a range of periodic frequencies, frequencies corresponding to one or more natural resonant frequencies of the droplet generator may be applied. Matching one or more applied frequencies to one or more droplet generator resonant frequencies may be effective in increasing cleaning efficiency. Alternatively, or in addition to sweeping through a range of periodic frequencies, the waveform shape may be modified during a cleaning mode period. For example, the rise-time or fall time of each wave period may be modified to change to applied frequency spectrum during a cleaning period.

FIGS. 2B and 4 show droplet generators having multiple electro-actuatable elements. In use, at least one of the electro-actuatable elements may be driven by a waveform to produce droplets that are suitable for EUV production. During a cleaning mode period, at least one other electro-actuatable element(s) may be driven by a waveform suitable for dislodging contaminants. The electro-actuatable elements for EUV production droplets may continue to be driven during the cleaning period by the same waveform as used during EUV production, a different waveform, or may be undriven (e.g., de-energized). The placement, number, size, shape and type of electro-actuatable element(s) used during cleaning mode may be different from the placement, number, size, shape and type of electro-actuatable element(s) used to produce droplets that are suitable for EUV production. In one arrangement, electro-actuatable element(s) used during cleaning mode are configured to produce vibrations that are aligned along the length of the capillary tube to excite longitudinal resonant modes.

It will be understood by those skilled in the art that the embodiments described above are intended to be examples only and are not intended to limit the scope of the subject matter which is broadly contemplated by the present application. It is to be appreciated by those skilled in the art that additions, deletions and modifications may be made to the disclosed embodiments within the scope of the subject matter disclosed herein. The appended claims are intended in scope and meaning to cover not only the disclosed embodiments but also such equivalents and other modifications and changes that would be apparent to those skilled in the art. Unless explicitly stated otherwise, reference to an element in the following Claims in the singular or a reference to an element preceded by the article "a" is intended to mean "one or more" of said element(s). None of the disclosure provided herein is intended to be dedicated to the public regardless of whether the disclosure is explicitly recited in the Claims.

What is claimed is:

1. A device comprising:
   a plasma generating system comprising a source of target material droplets and a laser producing a beam irradiating the droplets at an irradiation region to form a plasma, the plasma producing EUV radiation, wherein the droplet source is configured to elect a fluid from an orifice and a sub-system producing a first disturbance in the fluid during a first time period which generates droplets having differing initial velocities causing the spacing between at least some adjacent droplets to decrease as the droplets travel to the irradiation region, the sub-system producing a second disturbance different from the first disturbance at a second time period different from the first time period, the second disturbance cleans the orifice to a greater degree than the first disturbance.

2. The device of claim 1 wherein EUV radiation generated during both the first time period and the second time period is employed for photolithography purposes.

3. The device of claim 1 wherein EUV radiation generated during the first time period is employed for photolithography purposes but droplets generated during the second time period are not employed for producing EUV radiation for photolithography purposes.

4. The device of claim 1 wherein said first disturbance has a different maximum amplitude compared to the maximum amplitude of the second disturbance.

5. The device of claim 1 wherein said first disturbance employs a different waveform shape compared to the waveform shape of the second disturbance.

6. The device of claim 1 wherein said subsystem employs a first electro-actuable element to generate said first disturbance and a second electro-actuable element different from said first electro-actuable element to generate said second disturbance.

7. The device of claim 1 wherein said first disturbance comprises a frequency modulated disturbance waveform.

8. The device of claim 1 wherein said first disturbance comprises an amplitude modulated disturbance waveform.

9. The device of claim 1 wherein the sub-system produces a series of pulsed disturbances during said first time period, with each pulsed disturbance having at least one of a sufficiently short rise-time and sufficiently short fall-time to generate a fundamental frequency and at least one harmonic of the fundamental frequency.

10. The device of claim 1 wherein a first waveform is selected from the group of waveforms consisting of a square wave, rectangular wave and peaked-non-sinusoidal wave.

11. The device of claim 10 wherein a second waveform is selected from the group of waveforms consisting of a square wave, rectangular wave and peaked-non-sinusoidal wave.

12. The device of claim 10 wherein the first waveform is a peaked-non-sinusoidal wave selected from the group of waveforms consisting of a fast pulse waveform, a fast ramp waveform and a sine function waveform.

13. A method comprising the steps of:
   flowing a fluid toward an orifice;
   producing a first disturbance in the fluid during a first time period which generates droplets from the fluid, the droplets having differing initial velocities causing the spacing between at least some adjacent droplets to decrease as the droplets travel from the orifice; and
   producing a second disturbance different from the first disturbance at a second time period different from the first time period, the second disturbance cleans the orifice to a greater degree than the first disturbance.

14. The method of claim 13 further comprising irradiating the droplets during the first time period to generate EUV radiation for photolithography purposes.

15. The method of claim 14 wherein droplets generated during the second time period are not employed for producing EUV radiation for photolithography purposes.

16. The method of claim 13 wherein said first disturbance has a different maximum amplitude compared to the maximum amplitude of the second disturbance.

17. The method of claim 13 wherein said first disturbance employs a different waveform shape compared to the waveform shape of the second disturbance.

18. The method of claim 13 wherein said first disturbance comprises a frequency modulated disturbance waveform.

19. The method of claim 13 wherein said first disturbance comprises an amplitude modulated disturbance waveform.

20. The method of claim 13 wherein a first waveform is selected from the group of waveforms consisting of a square wave, rectangular wave and peaked-non-sinusoidal wave.

* * * * *